(12) United States Patent
Nagase et al.

(10) Patent No.: US 10,804,384 B2
(45) Date of Patent: Oct. 13, 2020

(54) SEMICONDUCTOR DEVICE AND MANUFACTURING METHOD THEREOF

(71) Applicant: ROHM CO., LTD., Kyoto-shi, Kyoto (JP)

(72) Inventors: Kazuya Nagase, Kyoto (JP); Shinya Takado, Kyoto (JP); Minoru Akutsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/232,659

(22) Filed: Dec. 26, 2018

(65) Prior Publication Data

US 2019/0207022 A1 Jul. 4, 2019

(30) Foreign Application Priority Data

Dec. 27, 2017 (JP) .................................. 2017-251656
Dec. 27, 2017 (JP) .................................. 2017-252257
Nov. 15, 2018 (JP) .................................. 2018-214868

(51) Int. Cl.
*H01L 29/778* (2006.01)
*H01L 29/66* (2006.01)
(Continued)

(52) U.S. Cl.
CPC .... *H01L 29/7787* (2013.01); *H01L 21/30612* (2013.01); *H01L 29/2003* (2013.01);
(Continued)

(58) Field of Classification Search
None
See application file for complete search history.

(56) References Cited

U.S. PATENT DOCUMENTS 10,340,360 B2 * 7/2019 Takado ............... H01L 29/7786
2014/0061725 A1 * 3/2014 Park ...................... H01L 29/778
257/194

(Continued)

FOREIGN PATENT DOCUMENTS

| JP | 2011192834 | 9/2011 |
| JP | 2015192004 | 11/2015 |
| JP | 2016163017 | 9/2016 |

*Primary Examiner* — Alexander G Ghyka
(74) *Attorney, Agent, or Firm* — Hamre, Schumann, Mueller & Larson, P.C.

(57) ABSTRACT

A semiconductor device includes: a back barrier layer containing $Al_xGa_{(1-x)}N$ (0<X≤1); an electron transit layer containing $Al_aIn_bGa_{(1-a-b)}N$ (0≤a+b≤1) and formed on the back barrier layer; a top barrier layer containing $Al_yGa_{(1-y)}N$ (0<Y≤1) and formed on the electron transit layer; an electron supply layer containing $Al_zGa_{(1-z)}N$ (0<Z≤1) and formed on the top barrier layer, the electron supply layer having an opening to expose the top barrier layer; a two-dimensional electron gas region formed in an area of a surface layer portion of the electron transit layer, the area opposing the electron supply layer with the top barrier layer interposed between the electron supply layer and the area; a gate insulating layer formed in the opening of the electron supply layer; and a gate electrode layer formed on the gate insulating layer and opposing the electron transit layer with the gate insulating layer interposed therebetween.

20 Claims, 31 Drawing Sheets

(51) Int. Cl.
  *H01L 29/51*   (2006.01)
  *H01L 29/423*  (2006.01)
  *H01L 29/40*   (2006.01)
  *H01L 21/306*  (2006.01)
  *H01L 21/28*   (2006.01)
  *H01L 21/311*  (2006.01)
  *H01L 29/20*   (2006.01)
  *H01L 29/205*  (2006.01)
  *H01L 21/02*   (2006.01)

(52) U.S. Cl.
  CPC .......... *H01L 29/205* (2013.01); *H01L 29/404* (2013.01); *H01L 29/42364* (2013.01); *H01L 29/513* (2013.01); *H01L 29/518* (2013.01); *H01L 29/66462* (2013.01); *H01L 21/02178* (2013.01); *H01L 21/02241* (2013.01); *H01L 21/02252* (2013.01); *H01L 21/28264* (2013.01); *H01L 21/31111* (2013.01)

(56) References Cited

U.S. PATENT DOCUMENTS

2017/0104093 A1\* 4/2017 Takado ............. H01L 29/66462
2017/0352755 A1 12/2017 Nishimori et al.

\* cited by examiner

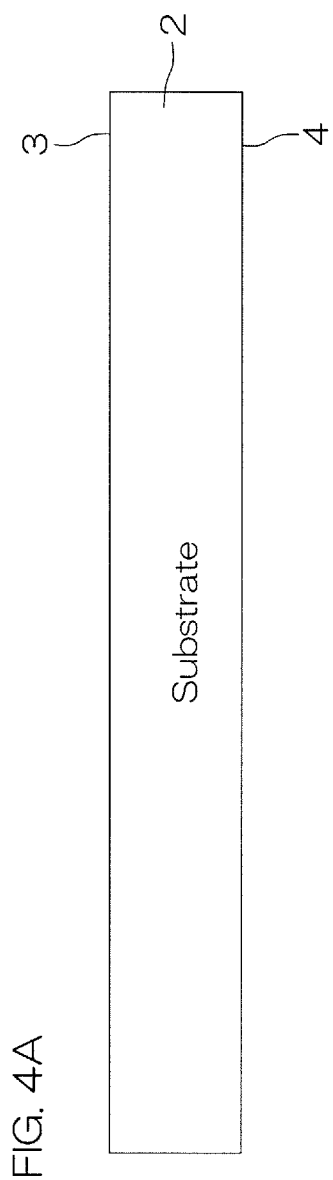

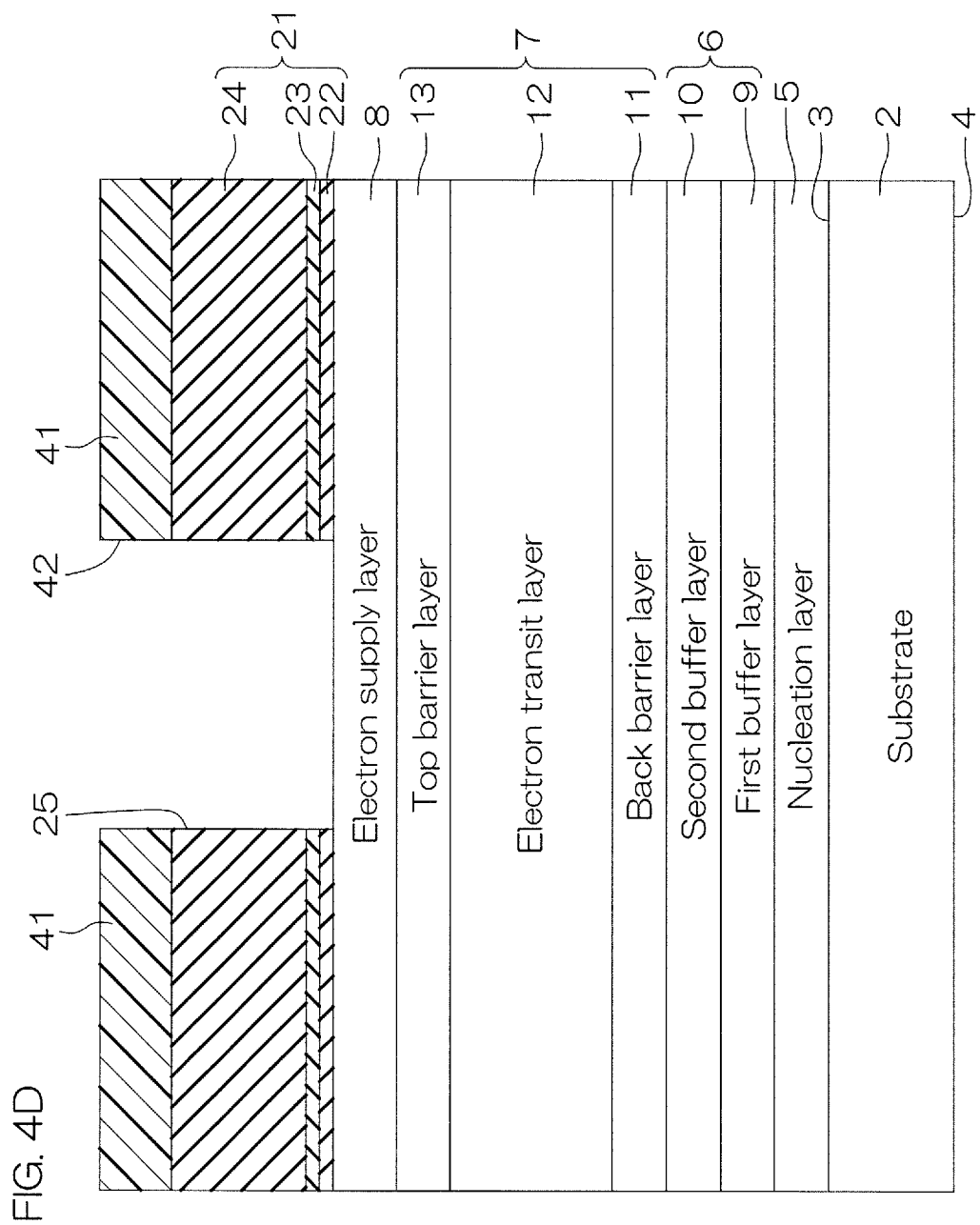

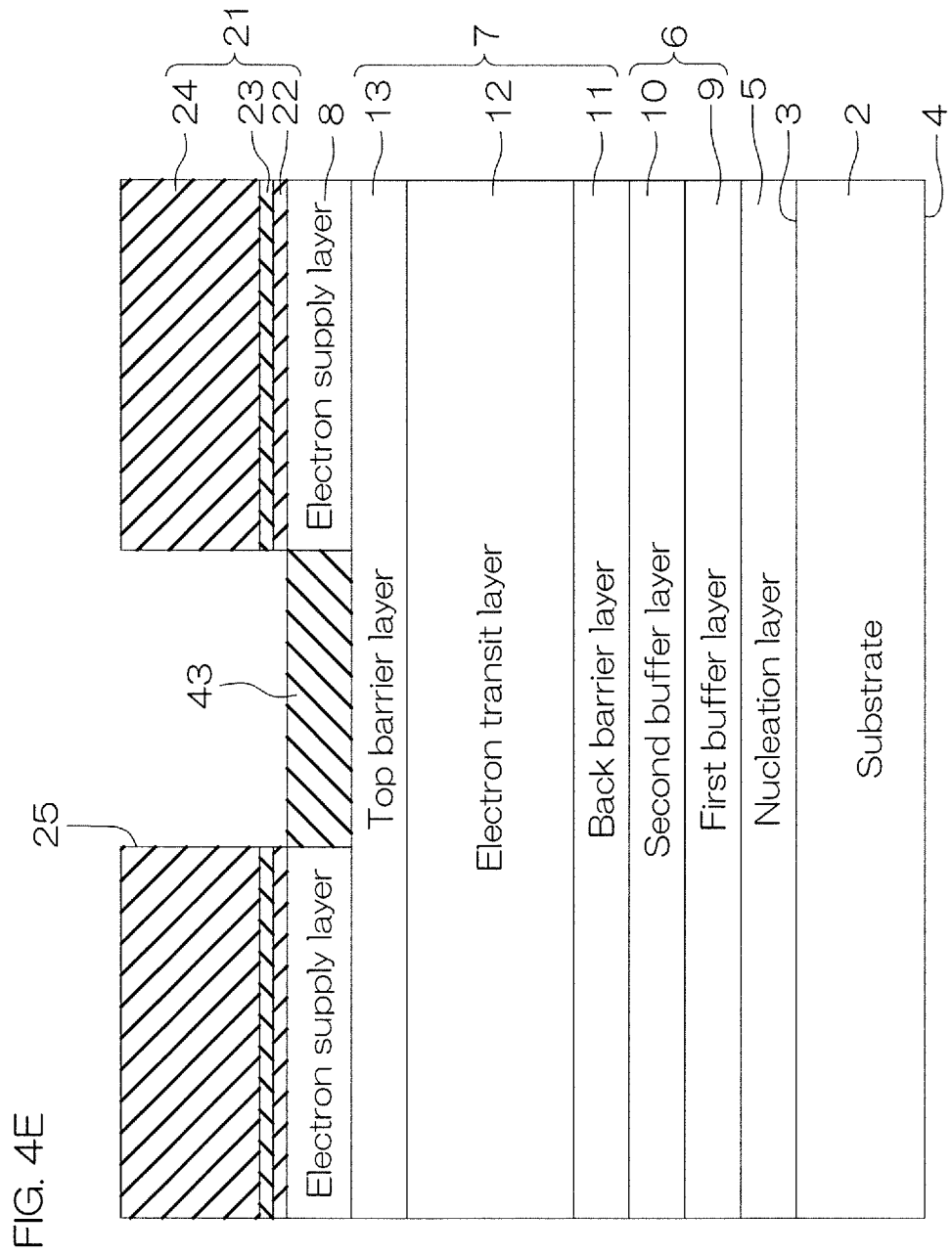

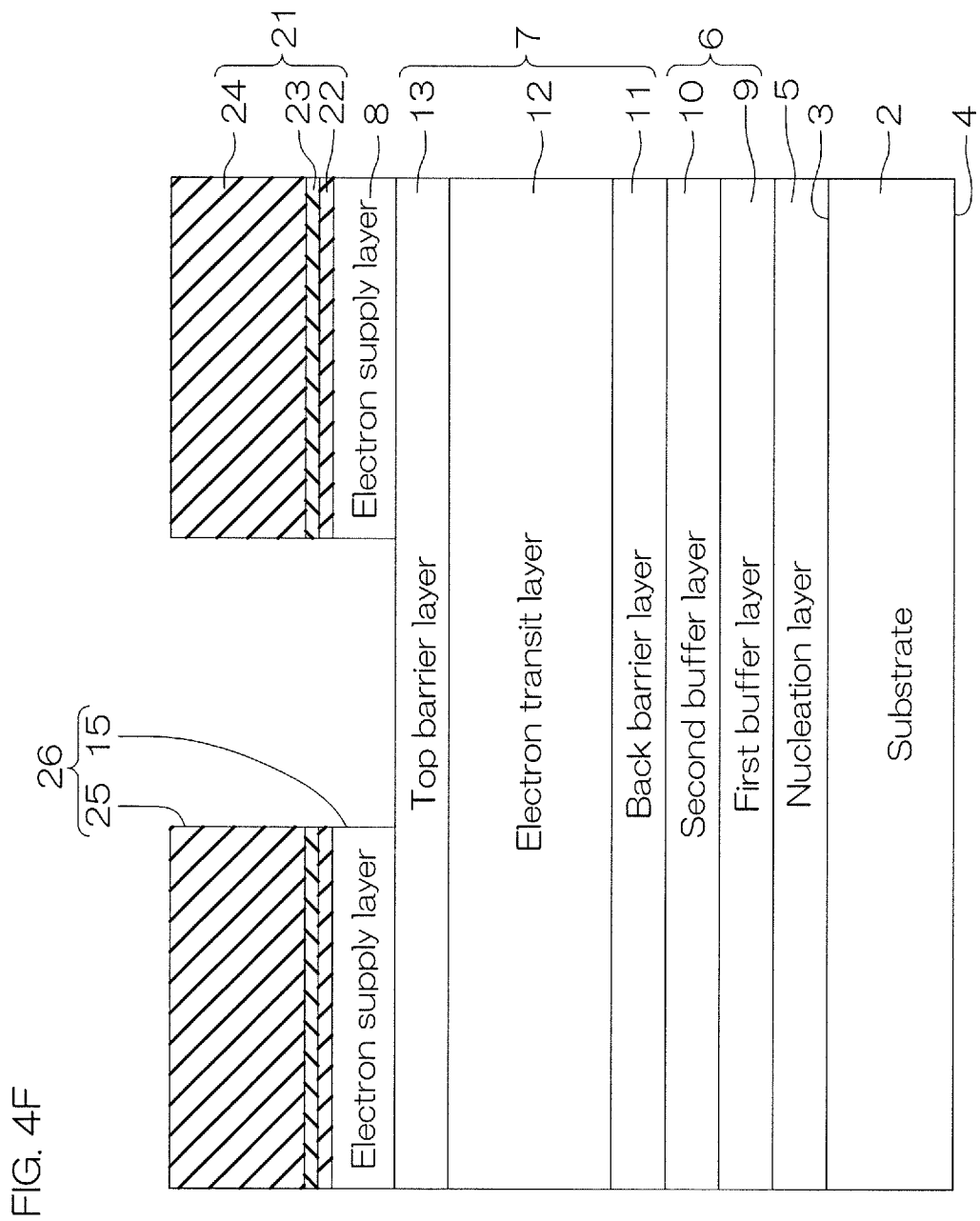

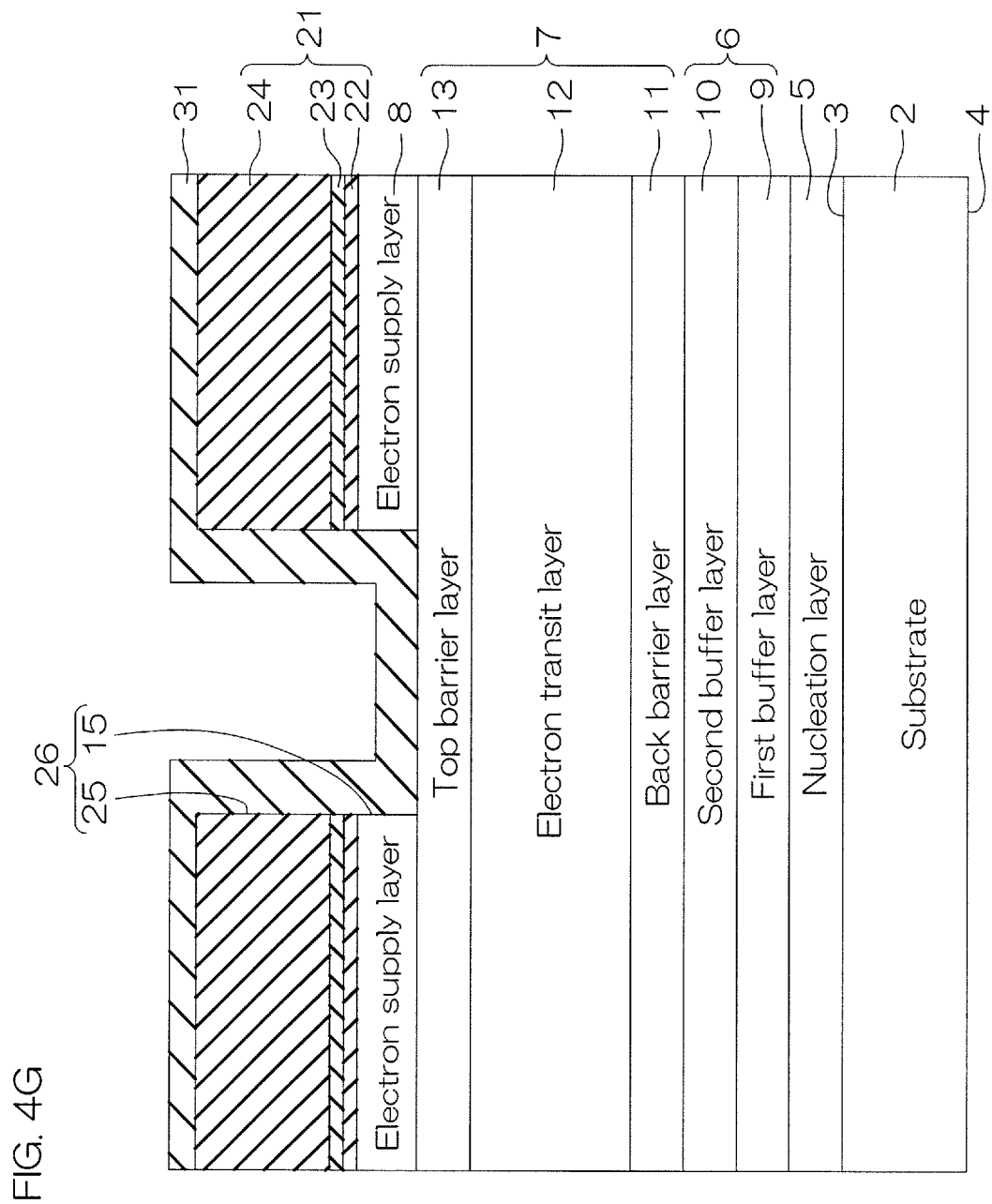

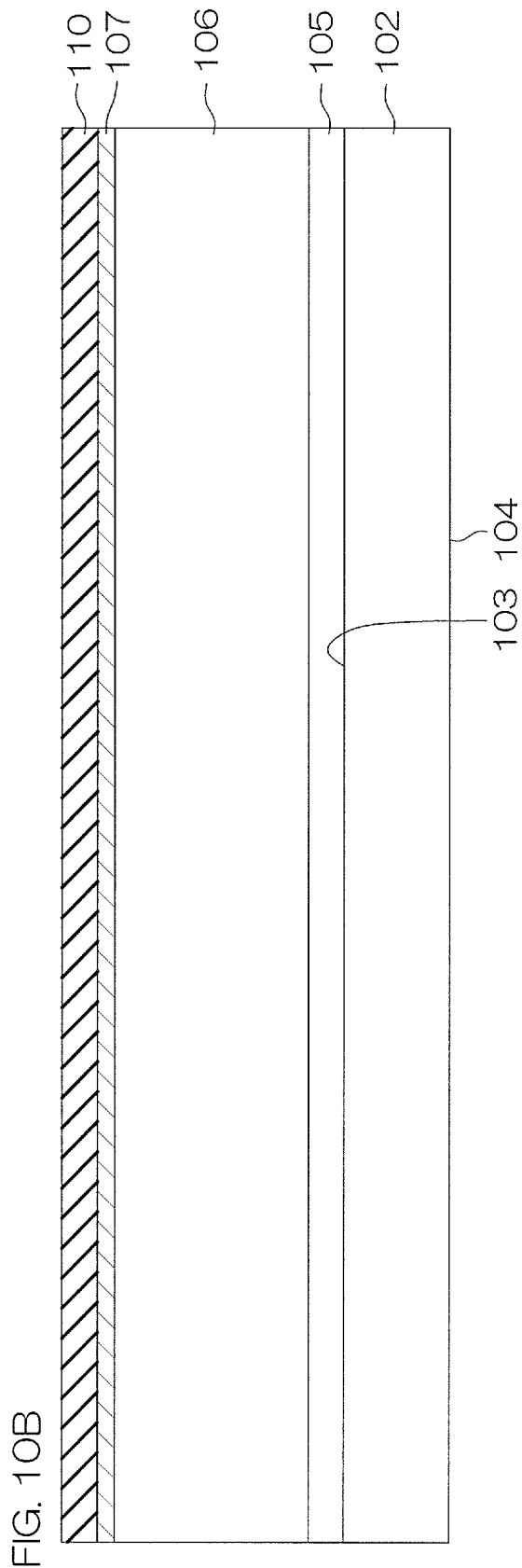

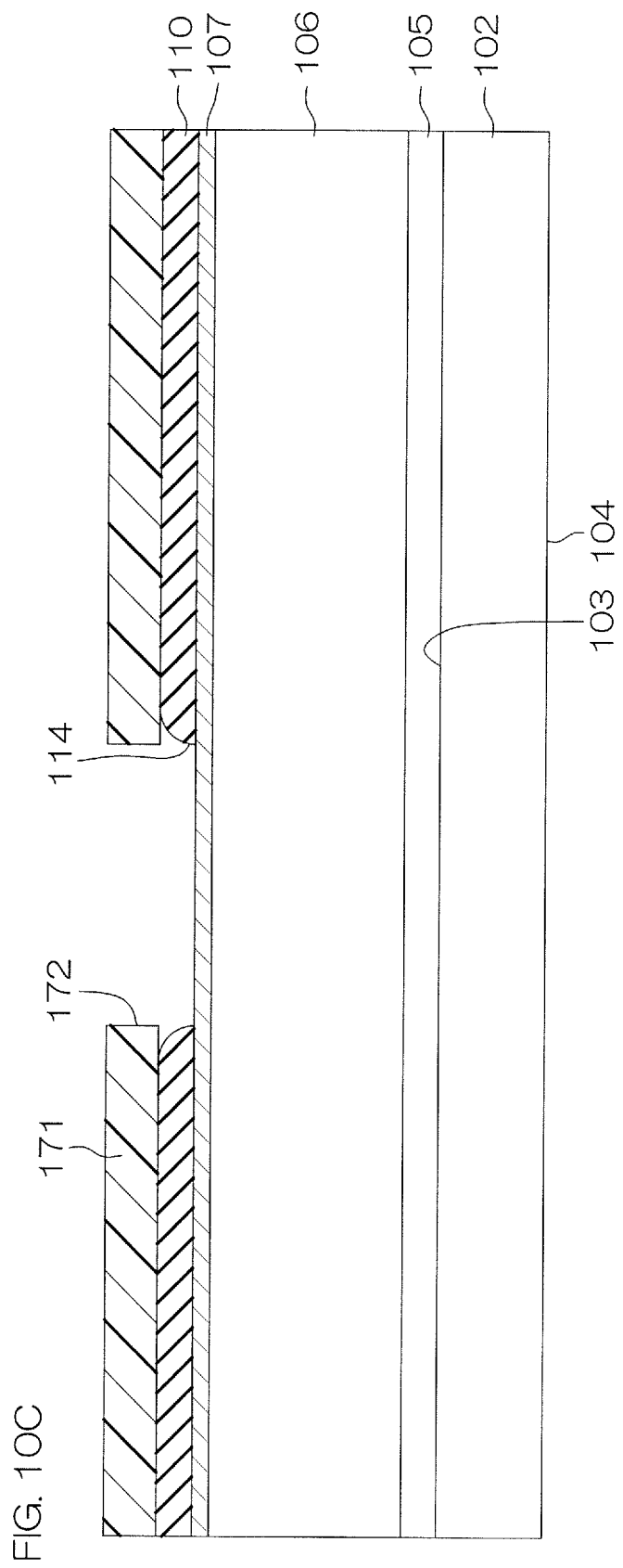

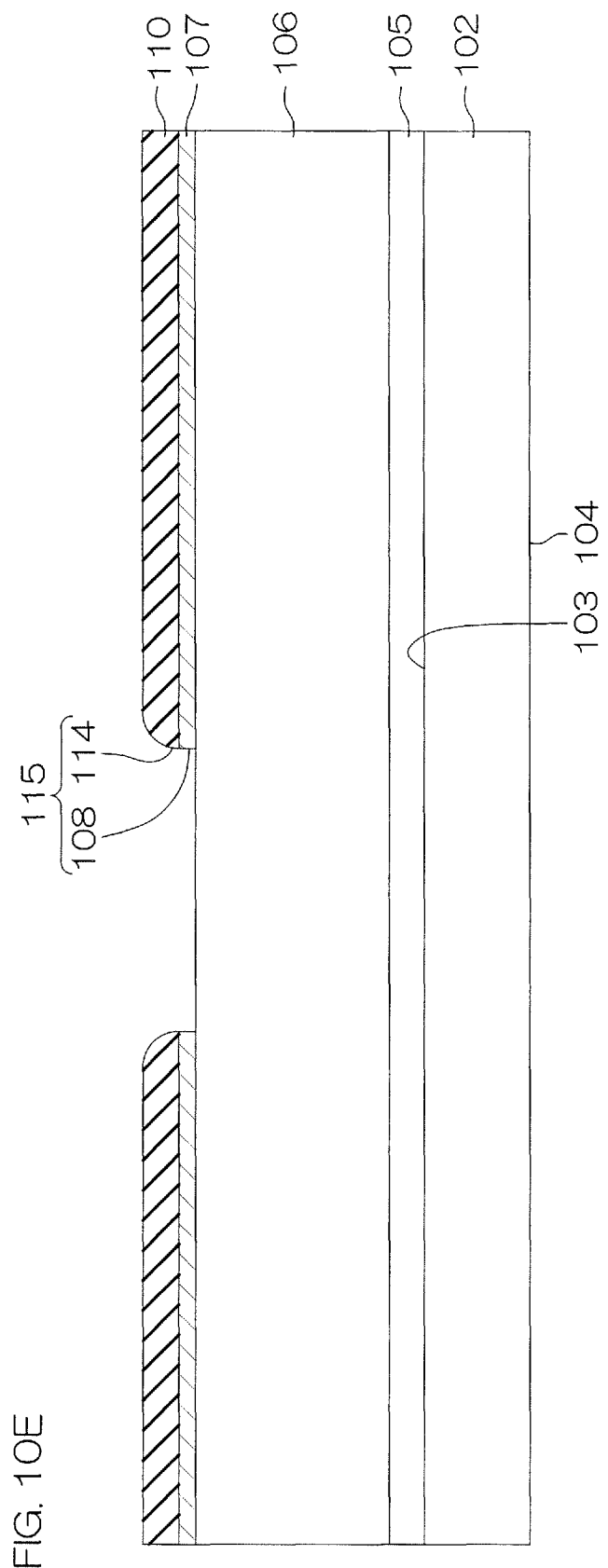

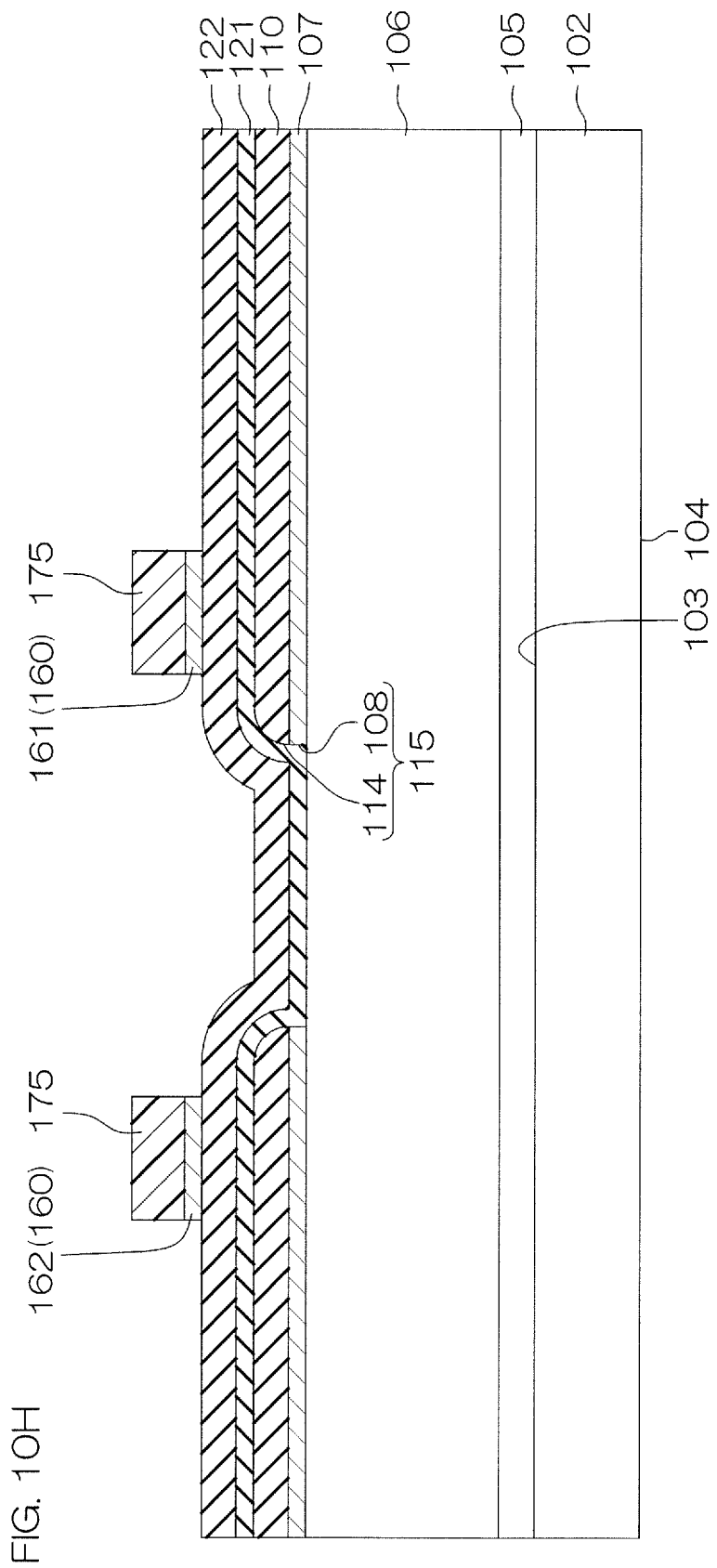

SEMICONDUCTOR DEVICE AND MANUFACTURING METHOD THEREOF

This application claims the benefit of priority to Japanese Patent Application No. 2017-251656 filed on Dec. 27, 2017, Japanese Patent Application No. 2017-252257 filed on Dec. 27, 2017, and Japanese Patent Application No. 2018-214868 filed on Nov. 15, 2018. The entire contents of these applications are hereby incorporated herein by reference.

BACKGROUND OF THE INVENTION

1. Field of the Invention

The present invention relates to a semiconductor device that includes a high electron mobility transistor (HEMT) and a method for manufacturing the semiconductor device.

2. Description of the Related Art

In view of the structure of the semiconductor device including the HEMT, it is difficult to make the semiconductor device normally OFF and there is a problem that the gate threshold voltage is relatively small. JP2015-192004A discloses an example structure that implements a normally-OFF device, while US20170352755A1 discloses an example of a structure that provides an increased gate threshold voltage.

The semiconductor device according to JP2015-192004A includes an i-GaN layer (an electron transit layer). On the i-GaN layer, an AlN spacer layer (an electron supply layer) is formed. On the AlN spacer layer, an InAlN barrier layer is formed. In the InAlN barrier layer and the AlN spacer layer, a recess to expose the i-GaN layer is formed. A gate electrode is embedded in the recess with a gate insulating layer interposed between the gate electrode and the i-GaN layer.

The semiconductor device according to US20170352755A1 includes a p type back barrier layer that is formed of a p type nitride semiconductor. On the p type back barrier layer, an electron transit layer is formed. On the electron transit layer, an electron supply layer is formed. On the electron supply layer, a source electrode, a drain electrode, and a gate electrode are formed. The gate threshold voltage is increased by the p type back barrier layer.

SUMMARY OF THE INVENTION

One preferred embodiment of the present invention provides a semiconductor device which includes the following: a back barrier layer containing $Al_XGa_{(1-X)}N$ ($0<X\le1$); an electron transit layer containing $Al_aIn_bGa_{(1-a-b)}N$ ($0\le a+b\le1$) and formed on the back barrier layer; a top barrier layer containing $Al_YGa_{(1-Y)}N$ ($0<Y\le1$) and formed on the electron transit layer; an electron supply layer containing $Al_ZGa_{(1-Z)}N$ ($0<Z\le1$) and formed on the top barrier layer, the electron supply layer having an opening to expose the top barrier layer; a two-dimensional electron gas region formed in a surface layer portion of the electron transit layer in an area thereof opposing the electron supply layer with the top barrier layer interposed between the electron supply layer and the area; a gate insulating layer formed in the opening of the electron supply layer; and a gate electrode layer formed on the gate insulating layer and opposing the electron transit layer with the gate insulating layer interposed between the gate electrode layer and the electron transit layer.

One preferred embodiment of the present invention provides a manufacturing method of a semiconductor device, the method including: a step of forming an electron transit layer containing $Al_aIn_bGa_{(1-a-b)}N$ ($0\le a+b\le1$) on a back barrier layer containing $Al_XGa_{(1-X)}N$ ($0<X\le1$); a step of forming a top barrier layer containing $Al_YGa_{(1-Y)}N$ ($0<Y\le1$) on the electron transit layer so that a conduction band energy level of an interface with the electron transit layer is greater than a Fermi energy level; a step of forming an electron supply layer containing $Al_ZGa_{(1-Z)}N$ ($0<Z\le1$) on the top barrier layer so that the conduction band energy level of the interface between the top barrier layer and the electron transit layer is smaller than the Fermi energy level; a step of oxidizing a portion of the electron supply layer into an oxide, removing the oxide to thereby form an opening to expose the top barrier layer in the electron supply layer, and making the conduction band energy level of the interface between the top barrier layer and the electron transit layer in an area opposing the opening to be greater than the Fermi energy level; a step of forming a gate insulating layer above the top barrier layer at a portion thereof being exposed from the opening of the electron supply layer; and a step of forming a gate electrode layer on the gate insulating layer.

The aforementioned or other objects, features, and effects of the present invention will be clarified by the following description of preferred embodiments given below with reference to the accompanying drawings.

BRIEF DESCRIPTION OF THE DRAWINGS

FIGS. 10A to 10M are cross-sectional views illustrating an example of a manufacturing method of the semiconductor device shown in FIG. 7.

DETAILED DESCRIPTION OF THE PREFERRED EMBODIMENTS

Figure 1:
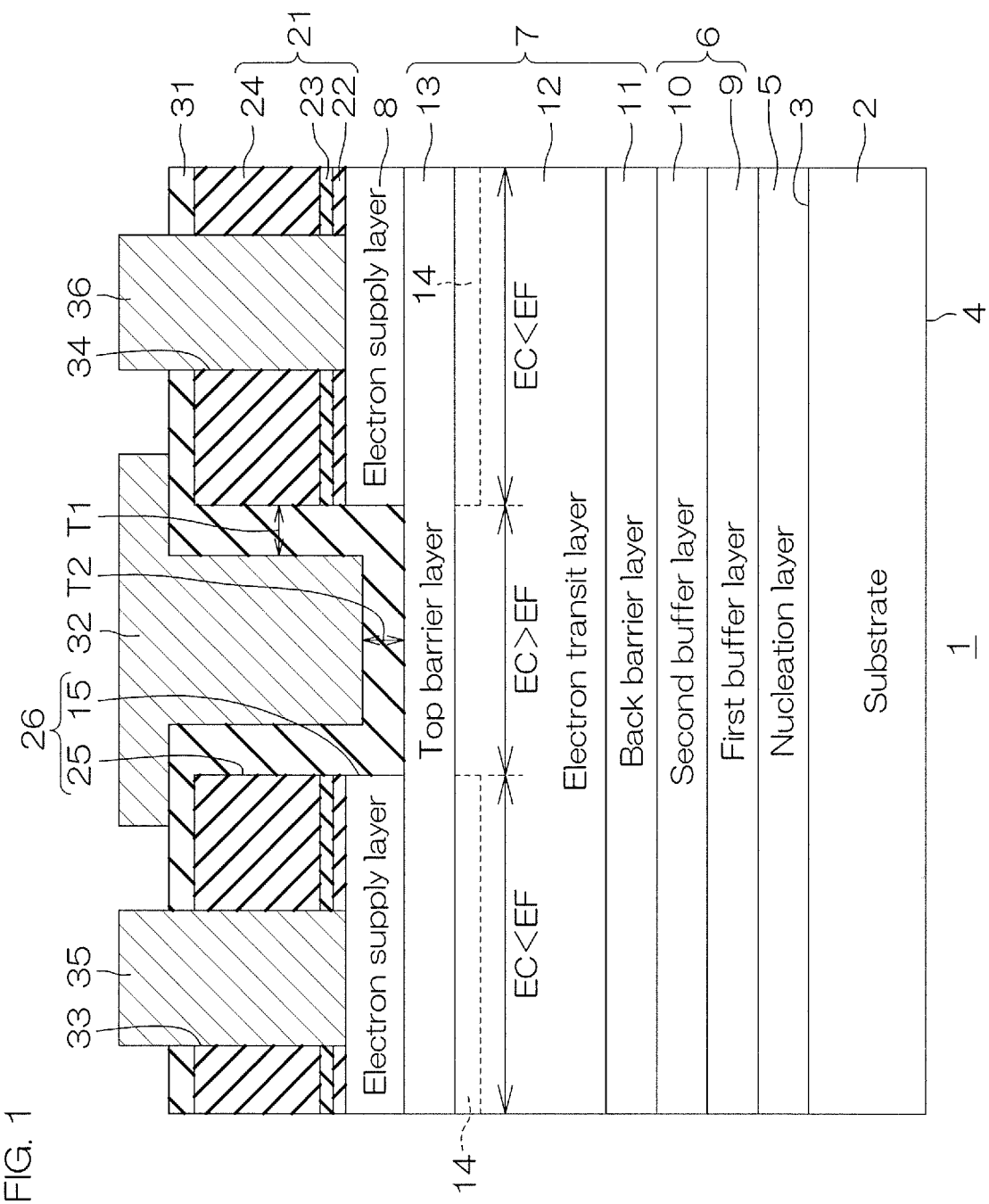
FIG. 1 is a cross-sectional view illustrating a semiconductor device according to a first preferred embodiment of the present invention.

In order to achieve a normally-OFF device, the semiconductor device according to JP2015-192004A must be provided with a recess to expose an electron transit layer (the i-GaN layer). In the step of forming the recess, the electron transit layer is necessarily exposed to the ambient atmosphere. This may possibly lead to an increase in channel resistance caused by the oxidation of the electron transit layer. Furthermore, in the case of the gate insulating layer being formed of an oxide insulating material, the electron transit layer may possibly be oxidized due to the material of the gate insulating layer.

On the other hand, in the semiconductor device according to US20170352755A1, the HEMT is turned ON or OFF using the p type impurities (holes) doped in the p type back barrier layer. The p type impurity (hole) has a characteristic of having a relatively low carrier mobility. Thus, the semiconductor device according to US20170352755A1 has an aspect that necessarily sacrifices the switching characteristic.

One preferred embodiment of the present invention provides a semiconductor device which is capable of suppressing an increase in channel resistance and increasing the gate threshold voltage, and a manufacturing method of such a semiconductor device.

One preferred embodiment of the present invention provides a semiconductor device which includes: a back barrier layer containing $Al_XGa_{(1-X)}N$ (0<X≤1); an electron transit layer containing $Al_aIn_bGa_{(1-a-b)}N$ (0≤a+b≤1) and formed on the back barrier layer; a top barrier layer containing $Al_YGa_{(1-Y)}N$ (0<Y≤1) and formed on the electron transit layer; an electron supply layer containing $Al_ZGa_{(1-Z)}N$ (0≤Z≤1) and formed on the top barrier layer, the electron supply layer having an opening to expose the top barrier layer; a two-dimensional electron gas region formed in a surface layer portion of the electron transit layer in an area thereof opposing the electron supply layer with the top barrier layer interposed between the electron supply layer and the area; a gate insulating layer formed in the opening of the electron supply layer; and a gate electrode layer formed on the gate insulating layer and opposing the electron transit layer with the gate insulating layer interposed between the gate electrode layer and the electron transit layer.

According to the semiconductor device, the top barrier layer is formed on the electron transit layer. Since the top barrier layer enables the electron transit layer to avoid being exposed to the ambient atmosphere, oxidation of the electron transit layer can be suppressed. As a result, an increase in channel resistance can be suppressed.

In the structure with the top barrier layer formed on the electron transit layer, such an effect is produced to reduce the gate threshold voltage due to a piezoelectric polarization that is caused between the electron transit layer and the top barrier layer. Thus, the semiconductor device has the electron transit layer formed on the back barrier layer containing $Al_XGa_{(1-X)}N$ (0<X≤1).

According to the back barrier layer, the piezoelectric polarization caused between the back barrier layer and the electron transit layer is capable of shifting the energy band of the electron transit layer on the back barrier layer side toward a higher energy side. This enables increasing the gate threshold voltage.

One preferred embodiment of the present invention provides a manufacturing method of a semiconductor device, the method including: a step of forming an electron transit layer containing $Al_aIn_bGa_{(1-a-b)}N$ (0≤a+b≤1) on a back barrier layer containing $Al_XGa_{(1-X)}N$ (0<X≤1); a step of forming a top barrier layer containing $Al_YGa_{(1-Y)}N$ (0<Y≤1) on the electron transit layer so that a conduction band energy level of an interface with the electron transit layer is greater than a Fermi energy level; a step of forming an electron supply layer containing $Al_ZGa_{(1-Z)}N$ (0<Z≤1) on the top barrier layer so that the conduction band energy level of the interface between the top barrier layer and the electron transit layer is smaller than the Fermi energy level; a step of oxidizing a portion of the electron supply layer into an oxide, removing the oxide to thereby form an opening to expose the top barrier layer in the electron supply layer, and making the conduction band energy level of the interface between the top barrier layer and the electron transit layer in an area opposing the opening to be greater than the Fermi energy level; a step of forming a gate insulating layer above the top barrier layer at a portion thereof being exposed from the opening of the electron supply layer; and a step of forming a gate electrode layer on the gate insulating layer.

According to the manufacturing method, the top barrier layer is formed on the electron transit layer. Since the top barrier layer enables the electron transit layer to avoid being exposed to the ambient atmosphere, oxidation of the electron transit layer can be suppressed. As a result, an increase in channel resistance can be suppressed.

In the structure with the top barrier layer formed on the electron transit layer, such an effect is produced to reduce the gate threshold voltage due to a piezoelectric polarization that is caused between the electron transit layer and the top barrier layer. Thus, the manufacturing method is adapted to form the electron transit layer on the back barrier layer containing $Al_XGa_{(1-X)}N$ (0<X≤1).

According to the back barrier layer, the piezoelectric polarization caused between the back barrier layer and the electron transit layer is capable of shifting the energy band of the electron transit layer on the back barrier layer side toward a higher energy side. This enables increasing the gate threshold voltage.

Now, the preferred embodiments of the present invention will be described in more detail with reference to the attached drawings.

FIG. 1 is a cross-sectional view illustrating a semiconductor device 1 according to a first preferred embodiment of the present invention.

The semiconductor device 1 has a fundamental arrangement with a high electron mobility transistor (HEMT) formed of a group III nitride semiconductor.

With reference to FIG. 1, the semiconductor device 1 includes a substrate 2. The substrate 2 may be, for example, an Si substrate, an SiC substrate, a sapphire substrate, or a GaN substrate. In the preferred embodiment, the substrate 2 is formed of an Si substrate. The substrate 2 includes a first major surface 3 on one surface and a second major surface 4 on the other surface.

On the first major surface 3 of the substrate 2, a nucleation layer 5, a buffer layer 6, a double hetero layered structure 7, and an electron supply layer 8 are stacked in this order. In the preferred embodiment, the nucleation layer 5 contains AlN. The thickness of the nucleation layer 5 may be 100-300 nm (both inclusive) (for example, approximately 200 nm).

The buffer layer 6 may have a single-layer structure formed of a single buffer layer 6. In the preferred embodiment, the buffer layer 6 has a layered structure in which a plurality of (two or more) buffer layers are stacked in layers. The plurality of buffer layers may be stacked on the nucleation layer 5 in the order in which the Al composition ratio gradually decreases in the direction of stacking.

In the preferred embodiment, the plurality of buffer layers include a first buffer layer 9 and a second buffer layer 10 which are stacked in this order from the top of the nucleation layer 5. The first buffer layer 9 contains $Al_\alpha Ga_{(1-\alpha)}N$ (0<α≤1). The second buffer layer 10 contains $Al_\beta Ga_{(1-\beta)}N$ (0<β<α≤1). The Al composition ratio α may be 0.52, while the Al composition ratio β may be 0.12.

The thickness of the first buffer layer 9 may be 50-200 nm (both inclusive) (for example, approximately 100 nm). The thickness of the second buffer layer 10 may be 50-200 nm (both inclusive) (for example, approximately 100 nm).

The double hetero layered structure 7 has a layered structure with a back barrier layer 11, an electron transit layer 12, and a top barrier layer 13, which are stacked in this order from the top of the buffer layer 6. The back barrier layer 11 contains $Al_XGa_{(1-X)}N$ ($0<X\leq 1$). The Al composition ratio X may be less than 1 ($X<1$). The thickness of the back barrier layer 11 may be 2-2000 nm (both inclusive) (for example, approximately 1000 nm).

The Al composition ratio X of the back barrier layer 11 is a design value that can take on various values depending on the electrical characteristics of the semiconductor device 1 (for example, the breakdown voltage), and therefore it cannot be uniquely determined. The lattice constant of the back barrier layer 11 varies depending on the electrical characteristics of the semiconductor device 1 (for example, the breakdown voltage) or the Al composition ratio X, and therefore it cannot be uniquely determined.

The Al composition ratio X may be 0.01-0.1 (both inclusive). The Al composition ratio X may also be 0.1-0.2 (both inclusive). The Al composition ratio X may also be 0.2-0.3 (both inclusive). The thickness of the back barrier layer 11 varies depending on the Al composition ratio X, and therefore it cannot be uniquely determined.

The electron transit layer 12 contains $Al_aIn_bGa_{(1-a-b)}N$ ($0\leq a+b\leq 1$). In the preferred embodiment, the electron transit layer 12 is formed of GaN. In the preferred embodiment, the a-axis lattice constant (=3.189 Å) of the electron transit layer 12 is greater than the a-axis lattice constant of the back barrier layer 11 containing Al in addition to GaN. The thickness of the electron transit layer 12 may be 50-300 nm (both inclusive).

The electron transit layer 12 may contain $Al_aIn_bGa_{(1-a-b)}N$ (GaN in the preferred embodiment) doped with no impurities. The electron transit layer 12 may also contain $Al_aIn_bGa_{(1-a-b)}N$ (GaN in the preferred embodiment) doped with carbon as an impurity.

The top barrier layer 13 contains $Al_YGa_{(1-Y)}N$ ($0<Y\leq 1$). The Al composition ratio Y maybe less than 1 ($Y<1$). The a-axis lattice constant of the top barrier layer 13 is smaller than the a-axis lattice constant of the electron transit layer 12 (=3.189 Å). The thickness and the Al composition ratio Y of the top barrier layer 13 may be determined on the basis of the graph of FIG. 2.

Figure 2:
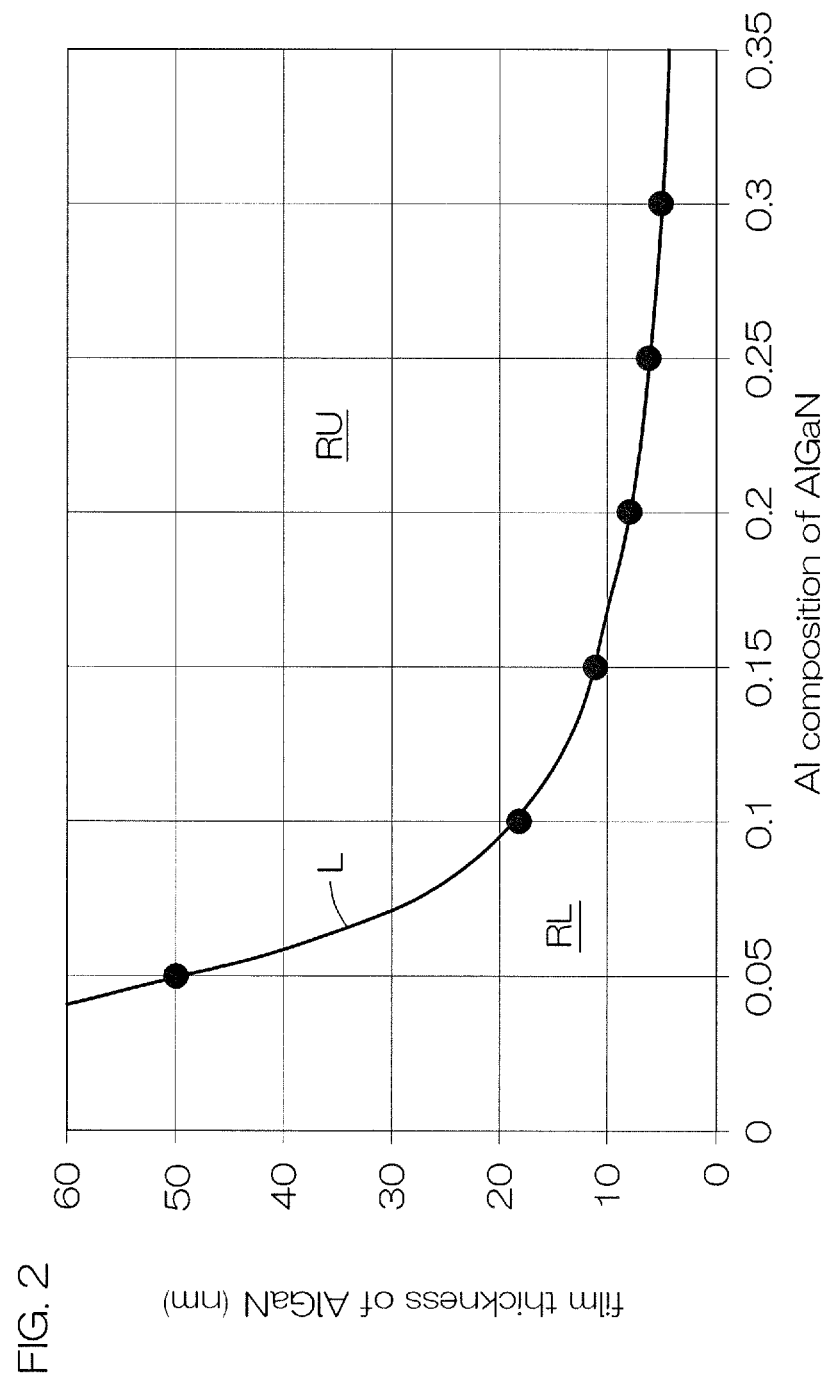
FIG. 2 is a graph showing the relationship between the thickness and the Al composition ratio of a top barrier layer.

FIG. 2 is a graph showing the relationship between the thickness and the Al composition ratio Y of the top barrier layer 13 shown in FIG. 1. In FIG. 2, the vertical axis represents the thickness, while the horizontal axis represents the Al composition ratio Y.

FIG. 2 shows a curved line L connecting between a plurality of plotted points. The curved line L shows the relationship between the thickness and the Al composition ratio Y of the top barrier layer 13. The coordinate plane formed by the vertical axis and the horizontal axis is divided into an upper area RU and a lower area RL with the curved line L.

In the upper area RU, a two-dimensional electron gas region 14 (to be discussed later) is formed in an area between the electron transit layer 12 and the top barrier layer 13 with no electron supply layer 8 formed on the double hetero layered structure 7.

In the lower area RL, no two-dimensional electron gas region 14 (to be discussed later) is formed in the area between the electron transit layer 12 and the top barrier layer 13 with no electron supply layer 8 formed on the double hetero layered structure 7.

The thickness and the Al composition ratio Y of the top barrier layer 13 are set to be positioned in the lower area RL in the coordinate plane of FIG. 2. That is, with no electron supply layer 8 formed on the double hetero layered structure 7, the conduction band energy level EC of the interface between the electron transit layer 12 and the top barrier layer 13 is greater than a Fermi energy level EF (EC>EF).

With reference to the curved line L, the thickness of the top barrier layer 13 may be 0.5-50 nm (both inclusive). On the other hand, the Al composition ratio Y of the top barrier layer 13 may be 0.05-0.3 (both inclusive). With the thickness of the top barrier layer 13 being 1.0 nm or greater, it is possible to keep a favorable influence of a penetration of the wave function of the two-dimensional electron gas region 14 (to be discussed later) into the top barrier layer 13 side.

Referring back to FIG. 1, the electron supply layer 8 is formed on the top barrier layer 13. The electron supply layer 8 contains $Al_ZGa_{(1-Z)}N$ ($0<Z\leq 1$) in a crystalline state. In the preferred embodiment, the electron supply layer 8 is formed of AlN in a crystalline state.

The a-axis lattice constant of the electron supply layer 8 is smaller than the a-axis lattice constants of the back barrier layer 11, the electron transit layer 12, and the top barrier layer 13. The thickness of the electron supply layer 8 may be 1-5 nm (both inclusive) (for example, approximately 2 nm). The electron supply layer 8 has an opening 15 formed to expose the top barrier layer 13.

The top barrier layer 13 has an exposed portion exposed from the opening 15 of the electron supply layer 8 and a covered portion covered with the electron supply layer 8. The exposed portion and the covered portion of the top barrier layer 13 form flat surfaces that integrally communicate with each other. The exposed portion of the top barrier layer 13 is not recessed by one step toward the substrate 2 with respect to the covered portion of the top barrier layer 13.

The conduction band energy level EC of the interface between the electron transit layer 12 and the top barrier layer is adjusted by the electron supply layer 8. More specifically, the conduction band energy level EC of an area opposing the electron supply layer 8 in the interface between the electron transit layer 12 and the top barrier layer 13 is smaller than the Fermi energy level EF in a steady state (EC<EF). Thus, in a steady state, the two-dimensional electron gas region 14 is present in the area of the surface layer portion of the electron transit layer 12 opposing the electron supply layer 8.

On the other hand, the conduction band energy level EC of an area opposing the opening 15 of the electron supply layer 8 in the interface between the electron transit layer 12 and the top barrier layer 13 is greater than the Fermi energy level EF in a steady state (EC>EF). Thus, in a steady state, the two-dimensional electron gas region 14 is not present in the area of the surface layer portion of the electron transit layer 12 opposing the opening 15 of the electron supply layer 8.

On the electron supply layer 8, a breakdown voltage sustaining insulation layer 21 (an insulating layer) is formed. In the preferred embodiment, the breakdown voltage sustaining insulation layer 21 has a layered structure that includes a flattened layer 22, a passivation layer 23, and a spacer layer 24, which are stacked in this order from the top of the electron supply layer 8.

The flattened layer 22 covers the electron supply layer 8. The flattened layer 22 is formed on the electron supply layer 8 in order to provide improved flatness. The flattened layer 22 may contain GaN. The flattened layer 22 may have a thickness of 1-5 nm (both inclusive) (for example, approximately 2 nm).

The passivation layer 23 covers the flattened layer 22. The passivation layer 23 may contain SiN. The passivation layer 23 suppresses trapping of charges and maintains the insulation characteristics of the breakdown voltage sustaining insulation layer 21. The passivation layer 23 may have a thickness of 1-40 nm (both inclusive) (for example, approximately 25 nm).

The spacer layer 24 covers the passivation layer 23. The spacer layer 24 is greater in thickness than the flattened layer 22 and the passivation layer 23. The spacer layer 24 is provided in order to space a gate electrode layer 32, which will be discussed later, apart from the electron supply layer 8. The spacer layer 24 may contain $SiO_2$. The spacer layer 24 may have a thickness of 10-100 nm (both inclusive) (for example, approximately 70 nm).

In the breakdown voltage sustaining insulation layer 21, a through hole 25 that communicates with the opening 15 of the electron supply layer 8 is formed. The through hole 25 of the breakdown voltage sustaining insulation layer 21 defines one gate contact hole 26 in conjunction with the opening 15 of the electron supply layer 8.

In a cross-sectional view, the gate contact hole 26 may be formed in a tapered shape with the opening area greater than the bottom area. The opening edge of the gate contact hole 26 may have an inward curved surface in the gate contact hole 26.

A gate insulating layer 31 is formed in the gate contact hole 26. The gate insulating layer 31 contains an oxide insulating material. The gate insulating layer 31 preferably contains an oxide insulating material in an amorphous state.

The oxide insulating material contains at least one type of $SiO_2$, SiON, $Al_2O_3$, HfSiO, and $HfO_2$. The gate insulating layer 31 may have a single-layer structure that is formed of an $SiO_2$ layer, an SiON layer, an $Al_2O_3$ layer, an HfSiO layer, or an $HfO_2$ layer. The gate insulating layer 31 may also have a layered structure that includes at least one of an $SiO_2$ layer, an SiON layer, an $Al_2O_3$ layer, an HfSiO layer, and an $HfO_2$ layer.

The gate insulating layer 31 may include an SiN layer in place of, or in addition to the oxide insulating material. The gate insulating layer 31 may have a layered structure that includes an oxide insulating material layer of at least one type of an $SiO_2$ layer, an SiON layer, an $Al_2O_3$ layer, an HfSiO layer, and an $HfO_2$ layer, and an SiN layer. In the preferred embodiment, the gate insulating layer 31 is formed of $SiO_2$ in an amorphous state.

The gate insulating layer 31 includes a first region and a second region. The first region is formed along the side wall of the gate contact hole 26. The second region is formed along the surface of the top barrier layer 13. The thickness T1 of the first region of the gate insulating layer 31 may be equal to or greater than the thickness T2 of the second region of the gate insulating layer 31 (T1≥T2). The thickness T1 of the first region of the gate insulating layer 31 is preferably greater than the thickness T2 of the second region of the gate insulating layer 31 (T1>T2).

The gate insulating layer 31 is led out in a film shape on the breakdown voltage sustaining insulation layer 21 along the inner wall of the gate contact hole 26. Thereby, the gate insulating layer 31 covers the surface of the breakdown voltage sustaining insulation layer 21. In the preferred embodiment, the gate insulating layer 31 covers substantially the whole surface of the breakdown voltage sustaining insulation layer 21.

The gate electrode layer 32 is formed on the gate insulating layer 31. The gate electrode layer 32 enters the gate contact hole 26 from the top of the breakdown voltage sustaining insulation layer 21. The gate electrode layer 32 has a cover portion which covers the breakdown voltage sustaining insulation layer 21 and opposes the electron supply layer 8 with the breakdown voltage sustaining insulation layer 21 interposed between the electron supply layer 8 and the cover portion.

The gate electrode layer 32 opposes the side wall of the gate contact hole 26 in the gate contact hole 26 with the first region of the gate insulating layer 31 interposed between the gate electrode layer 32 and the side wall of the gate contact hole 26. The gate electrode layer 32 opposes the top barrier layer 13 in the gate contact hole 26 with the second region of the gate insulating layer 31 interposed between the gate electrode layer 32 and the top barrier layer 13.

The static capacitance of a portion of the gate electrode layer 32 opposing the side wall of the gate contact hole 26 with the first region of the gate insulating layer 31 interposed therebetween is smaller than the static capacitance of a portion of the gate electrode layer 32 opposing the top barrier layer 13 with the second region of the gate insulating layer 31 interposed therebetween. This enables reducing switching noise.

A drain contact hole 33 and a source contact hole 34 are formed in the gate insulating layer 31. The drain contact hole 33 is formed in an area of the gate insulating layer 31 opposing the electron supply layer 8. The drain contact hole 33 penetrates the gate insulating layer 31 and the breakdown voltage sustaining insulation layer 21 to expose the electron supply layer 8.

The source contact hole 34 is formed in the gate insulating layer 31 in an area thereof that opposes the electron supply layer 8 and is different from the area of the drain contact hole 33. The source contact hole 34 penetrates the gate insulating layer 31 and the breakdown voltage sustaining insulation layer 21 to expose the electron supply layer 8.

A drain electrode 35 is embedded in the drain contact hole 33. The drain electrode 35 is electrically connected to the electron supply layer 8 in the drain contact hole 33. A source electrode 36 is embedded in the source contact hole 34. The source electrode 36 is electrically connected to the electron supply layer 8 in the source contact hole 34.

When a gate voltage of a predetermined gate threshold voltage Vth or greater is applied to the gate electrode layer 32, the conduction band energy level EC becomes smaller than the Fermi energy level EF (EC<EF) in an area in the surface layer portion of the electron transit layer 12 immediately below the gate electrode layer 32. This causes the two-dimensional electron gas region 14 to be formed in the area in the surface layer portion in the electron transit layer 12 immediately below the gate electrode layer 32 and allows a current to flow between the drain electrode 35 and the source electrode 36.

On the other hand, when a gate voltage less than the gate threshold voltage Vth is applied to the gate electrode layer 32, the conduction band energy level EC of an area in the surface layer portion of the electron transit layer 12 immediately below the gate electrode layer 32 is greater than the Fermi energy level EF (EC>EF).

In this case, the two-dimensional electron gas region 14 is not formed in the area in the surface layer portion of the electron transit layer 12 immediately below the gate electrode layer 32. Thus, no current flows between the drain electrode 35 and the source electrode 36. Thereby, the normally OFF operation is achieved in the semiconductor device 1.

Figure 3:
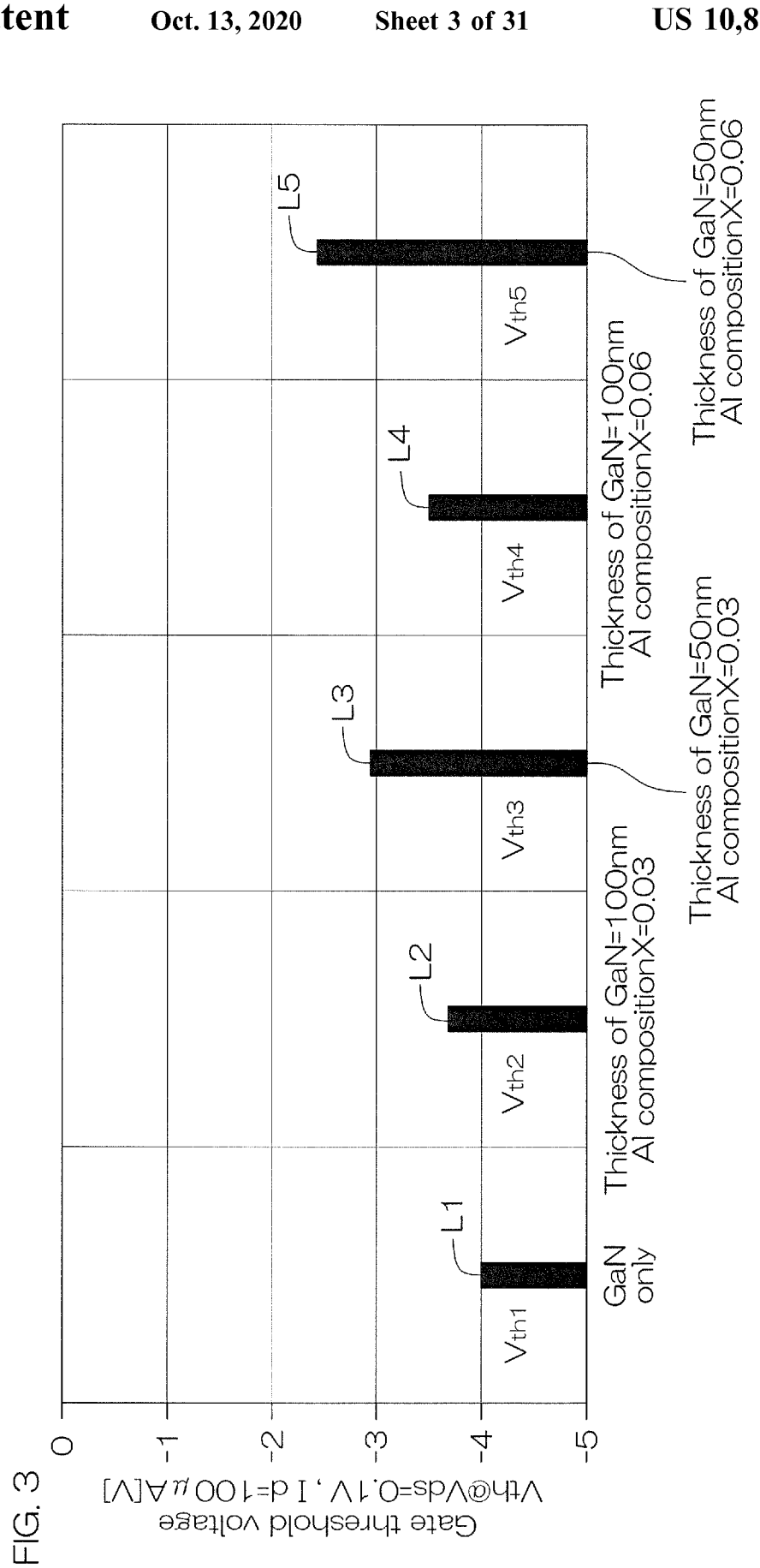
FIG. 3 is a graph showing the results examined by simulation concerning the effects achieved by introducing a back barrier layer.

FIG. 3 is a graph showing the results obtained by simulating the effects of introducing the back barrier layer 11. In FIG. 3, the vertical axis represents the gate threshold voltage Vth, while the horizontal axis represents the item axis. Here, the gate threshold voltage Vth was examined using a model of the normally ON operation. Although the gate threshold voltage Vth has a negative value, the effects of introducing the back barrier layer 11 are not substantially different between the normally ON operation and the normally OFF operation.

FIG. 3 shows a first bar graph L1, a second bar graph L2, a third bar graph L3, a fourth bar graph L4, and a fifth bar graph L5. The first bar graph L1 indicates a first gate threshold voltage Vth1 of a semiconductor device according to a comparative example. The semiconductor device according to the comparative example has substantially the same structure as that of the semiconductor device 1 except that the semiconductor device according to the comparative example includes no back barrier layer 11. Specific explanation of the semiconductor device according to the comparative example will be omitted.

The second bar graph L2 indicates a second gate threshold voltage Vth2 when the electron transit layer 12 is set to have a thickness of 100 nm, and the back barrier layer 11 is set to have an Al composition ratio X of 0.03 in $Al_XGa_{(1-X)}N$ in the semiconductor device 1.

The third bar graph L3 indicates a third gate threshold voltage Vth3 when the electron transit layer 12 is set to have a thickness of 50 nm, and the back barrier layer 11 is set to have an Al composition ratio X of 0.03 in $Al_XGa_{(1-X)}N$ in the semiconductor device 1.

The fourth bar graph L4 indicates a fourth gate threshold voltage Vth4 when the electron transit layer 12 is set to have a thickness of 100 nm, and the back barrier layer 11 is set to have an Al composition ratio X of 0.06 in $Al_XGa_{(1-X)}N$ in the semiconductor device 1.

The fifth bar graph L5 indicates a fifth gate threshold voltage Vth5 when the electron transit layer 12 is set to have a thickness of 50 nm, and the back barrier layer 11 is set to have an Al composition ratio X of 0.06 in $Al_XGa_{(1-X)}N$ in the semiconductor device 1.

With reference to the first bar graph L1, the first gate threshold voltage Vth1 was −4 V. With reference to the second bar graph L2, the second gate threshold voltage Vth2 was −3.7 V. With reference to the third bar graph L3, the third gate threshold voltage Vth3 was −2.9 V. With reference to the fourth bar graph L4, the fourth gate threshold voltage Vth4 was −3.5 V. With reference to the fifth bar graph L5, the fifth gate threshold voltage Vth5 was −2.5 V.

From these facts, according to the semiconductor device 1, it was found that the gate threshold voltage Vth becomes greater (shifts in the positive direction) when compared with the semiconductor devices according to the comparative examples.

Furthermore, with reference to the second bar graph L2 and the third bar graph L3, and to the fourth bar graph L4 and the fifth bar graph L5, it was found that, even with the same Al composition ratio X, the smaller the thickness of the electron transit layer 12, the greater the gate threshold voltage Vth becomes (shifts in the positive direction).

Furthermore, with reference to the second bar graph L2 and the fourth bar graph L4, and to the third bar graph L3 and the fifth bar graph L5, it was found that, even with the same thickness of the electron transit layer 12, the greater the Al composition ratio X, the greater the gate threshold voltage Vth becomes (shifts in the positive direction).

As described above, according to the semiconductor device 1, the top barrier layer 13 is formed on the electron transit layer 12. Since the top barrier layer 13 enables the electron transit layer 12 to avoid being exposed to the ambient atmosphere, oxidation of the electron transit layer 12 can be suppressed. As a result, an increase in channel resistance can be suppressed.

In the structure where the top barrier layer 13 is formed on the electron transit layer 12, the piezoelectric polarization caused between the electron transit layer 12 and the top barrier layer 13 exerts effects in the direction to reduce the gate threshold voltage Vth. Thus, the semiconductor device 1 is adapted such that the electron transit layer 12 is formed on the back barrier layer 11 containing $Al_XGa_{(1-X)}N$ ($0<X\leq1$).

According to the back barrier layer 11, the piezoelectric polarization caused between the back barrier layer 11 and the electron transit layer 12 enables the energy band of the electron transit layer 12 on the back barrier layer 11 side to be shifted toward a higher energy. This can improve the carrier mobility and as shown in FIG. 3, increase the gate threshold voltage Vth at the same time.

FIGS. 4A to 4J are cross-sectional views illustrating an example of a manufacturing method of the semiconductor device 1 shown in FIG. 1.

With reference to FIG. 4A, first, the substrate 2 having the first major surface 3 and the second major surface 4 is prepared. In the preferred embodiment, the substrate 2 is an Si substrate.

Figure 4B:
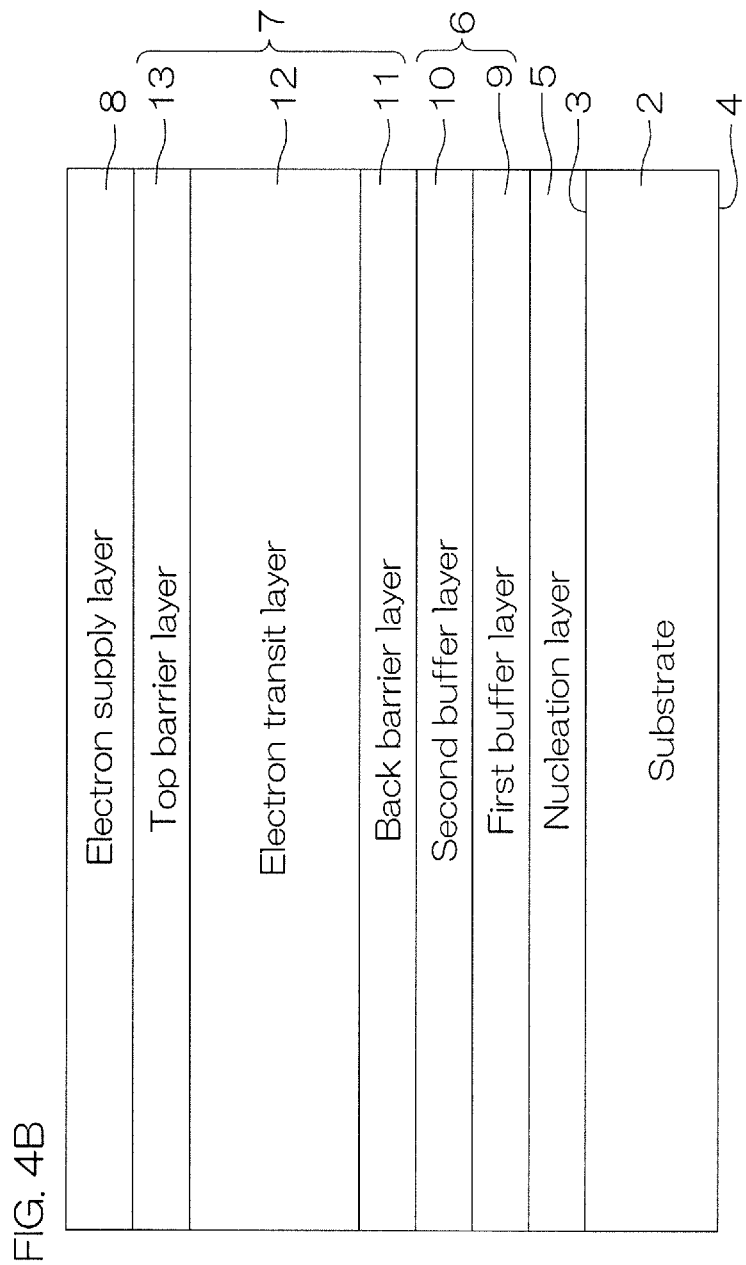
FIGS. 4A to 4J are cross-sectional views illustrating an example of a manufacturing method of the semiconductor device shown in FIG. 1.

Next, with reference to FIG. 4B, the nucleation layer 5, the buffer layer 6, the double hetero layered structure 7, and the electron supply layer 8 are formed in this order on the first major n surface 3 of the substrate 2. The nucleation layer 5, the buffer layer 6, the double hetero layered structure 7, and the electron supply layer 8 are formed each by epitaxial growth.

More specifically, the nucleation layers is formed by epitaxially growing AlN from the top of the substrate 2. The buffer layer 6 is formed by epitaxially growing AlGaN from the top of the nucleation layer 5.

In the preferred embodiment, the step of forming the buffer layer 6 includes steps of forming the first buffer layer 9 and the second buffer layer 10 in this order from the top of the nucleation layer 5. The first buffer layer 9 is formed by epitaxially growing $Al_\alpha Ga_{(1-\alpha)}N$ from the top of the nucleation layer 5. The second buffer layer 10 is formed by epitaxially growing $Al_\beta Ga_{(1-\beta)}N$ from the top of the first buffer layer 9.

The step of forming the double hetero layered structure 7 includes steps of forming the back barrier layer 11, the electron transit layer 12, and the top barrier layer 13 in this order on the top of the buffer layer 6.

The back barrier layer 11 is formed by epitaxially growing $Al_XGa_{(1-X)}N$ from the top of the buffer layer 6. The electron transit layer 12 is formed by epitaxially growing $Al_aIn_bGa_{(1-a-b)}N$ (GaN in the preferred embodiment) from the top of the back barrier layer 11.

The top barrier layer 13 is formed by epitaxially growing $Al_YGa_{(1-Y)}N$ from the top of the electron transit layer 12. The top barrier layer 13 is formed on the top of the electron transit layer 12 so that the conduction band energy level EC of the interface with the electron transit layer 12 is greater than the Fermi energy level EF (EC>EF).

The electron supply layer 8 is formed by epitaxially growing Al$_Z$Ga$_{(1-Z)}$N (AlN in the preferred embodiment) from the top of the top barrier layer 13. The electron supply layer 8 is formed on the top barrier layer 13 so that the conduction band energy level EC of the interface between the electron transit layer 12 and the top barrier layer 13 is smaller than the Fermi energy level EF (EC<EF).

Figure 4C:
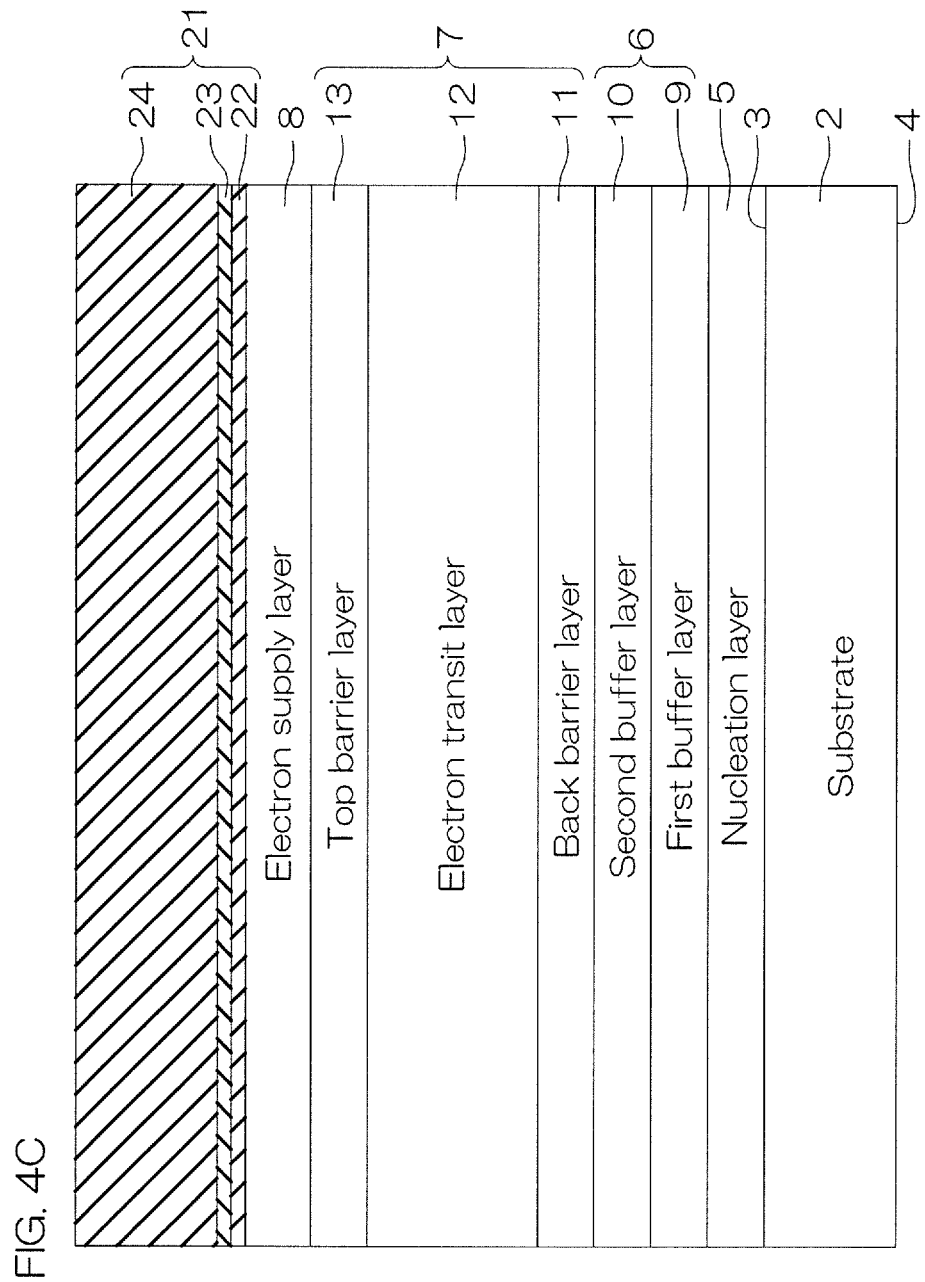

Next, with reference to FIG. 4C, the breakdown voltage sustaining insulation layer 21 is formed on the electron supply layer 8. The step of forming the breakdown voltage sustaining insulation layer 21 includes steps of forming the flattened layer 22, the passivation layer 23, and the spacer layer 24 in this order from the top of the electron supply layer 8.

The flattened layer 22 is formed by epitaxially growing GaN from the top of the electron supply layer 8. The passivation layer 23 may be formed by a CVD method. The passivation layer 23 may contain SiN. The spacer layer 24 may be formed by a CVD method. The spacer layer 24 may contain SiO$_2$.

Next, with reference to FIG. 4D, a mask 41 having a predetermined pattern is formed on the breakdown voltage sustaining insulation layer 21. The mask 41 may be a resist mask that is formed of a photosensitive resin. The mask 41 has an opening 42 to expose an area in which the through hole 25 is to be formed.

Next, an unnecessary portion of the breakdown voltage sustaining insulation layer 21 is removed. The unnecessary portion of the breakdown voltage sustaining insulation layer 21 maybe removed by etching through the mask 41. Thereby, the through hole 25 is formed in the breakdown voltage sustaining insulation layer 21 to expose the electron supply layer 8. After the through hole 25 is formed, the mask 41 is removed.

Next, with reference to FIG. 4E, the portion in the electron supply layer 8 exposed from the through hole 25 of the breakdown voltage sustaining insulation layer 21 is oxidized by an oxidation treatment method. Thereby, an oxide 43 of the electron supply layer 8 is formed in the through hole 25 of the breakdown voltage sustaining insulation layer 21. The oxide 43 may contain AlON or Al$_2$O$_3$.

The oxidation treatment method may be a plasma oxidation treatment method. The plasma oxidation treatment method is performed in an oxygen gas atmosphere until the portion of the electron supply layer 8 exposed from the through hole 25 is completely oxidized. The processing temperature may be 100-900° C. (both inclusive). The processing time may be 1-15 hours (both inclusive). The oxygen concentration in the oxygen gas may be approximately 30%.

According to the plasma oxidation treatment method, the oxygen in the atmosphere dose not or hardly enters the top barrier layer 13 after the oxide 43 is formed. Thus, the surface of the top barrier layer 13 is not oxidized or hardly oxidized.

Next, with reference to FIG. 4F, the oxide 43 is removed. This allows the opening 15 communicating with the through hole 25 of the breakdown voltage sustaining insulation layer 21 to be formed in the electron supply layer 8, thereby forming one gate contact hole 26 that includes the opening 15 and the through hole 25.

Furthermore, as a result of the removal of the oxide 43, the conduction band energy level EC of the interface between the top barrier layer 13 and the electron transit layer 12 in an area exposed from the gate contact hole 26 becomes greater than the Fermi energy level EF (EC>EF).

The oxide 43 may be removed by etching (for example, wet etching). The etching liquid may be a sulfuric acid hydrogen peroxide mixture (SPM) that contains a sulfuric acid and a hydrogen peroxide solution. The oxide 43 is different in the etching selection ratio from the electron supply layer 8 and the top barrier layer 13 in that the oxide 43 contains oxygen atoms but no gallium atoms.

Thus, at the time of removal of the oxide 43, the electron supply layer 8 and the top barrier layer 13 are hardly removed. This allows a portion of the top barrier layer 13 forming the bottom wall of the opening 15 and a portion of the top barrier layer 13 in contact with the electron supply layer 8 to present flattened surfaces that are flash with each other.

Furthermore, the step is conducted while the electron transit layer 12 is covered with the top barrier layer 13. Thus, exposure of the electron transit layer 12 to the ambient atmosphere can be avoided. Thereby, since oxidation of the electron transit layer 12 can be suppressed, it is possible to suppress an increase in channel resistance.

Next, with reference to FIG. 4G, the gate insulating layer 31 is formed on the top barrier layer 13. In the preferred embodiment, the gate insulating layer 31 is formed to be led out in a film shape on the breakdown voltage sustaining insulation layer 21 along the inner wall of the gate contact hole 26. In the preferred embodiment, the gate insulating layer 31 contains SiO$_2$ in an amorphous state. The gate insulating layer 31 may be formed by a CVD method.

Figure 4H:
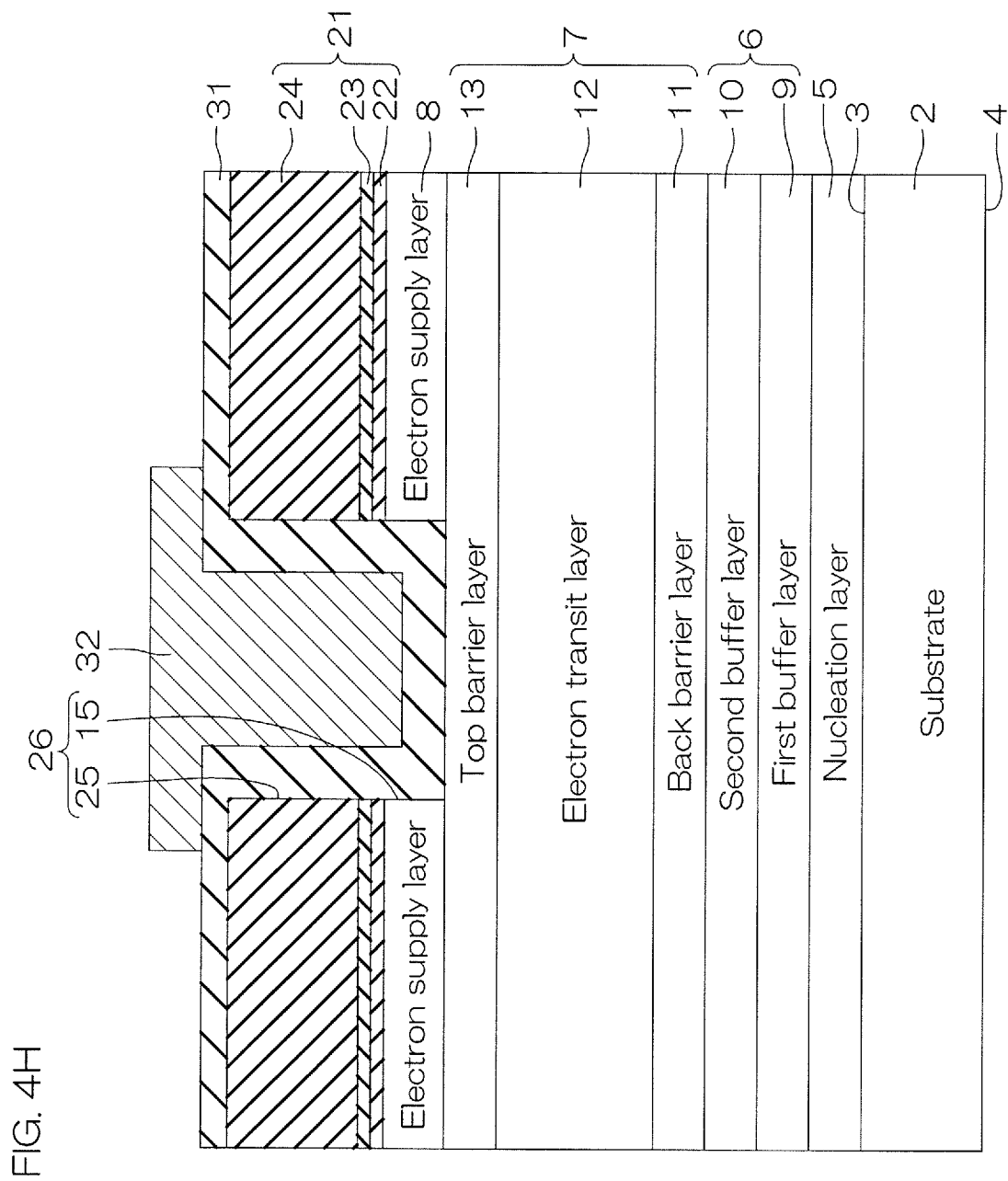
Figure 4:
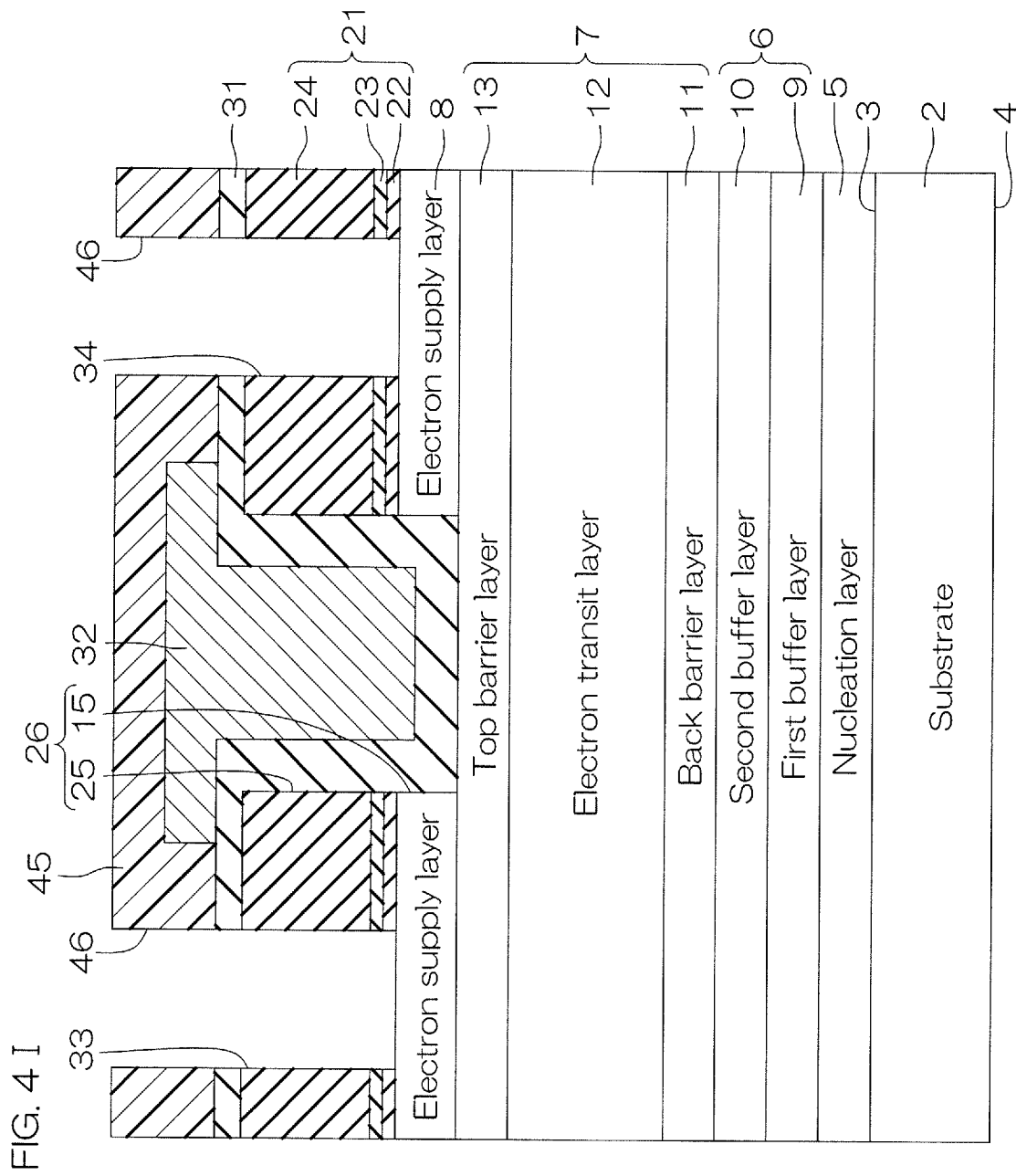

Next, with reference to FIG. 4H, the gate electrode layer 32 is formed on the gate insulating layer 31. The gate electrode layer 32 may be formed through formation of an electrically conductive layer by a CVD method and patterning of the electrically conductive layer by etching.

Next, with reference to FIG. 4I, a mask 45 having a predetermined pattern is formed on the gate insulating layer 31. The mask 45 may be a resist mask that is formed of a photosensitive resin. The mask 45 has openings 46 to expose areas in which the drain contact hole 33 and the source contact hole 34 are to be formed.

Next, an unnecessary portions of the gate insulating layer 31 and an unnecessary portions of the breakdown voltage sustaining insulation layer 21 are removed until the electron supply layer 8 is exposed. The unnecessary portions of the gate insulating layer 31 and the unnecessary portions of the breakdown voltage sustaining insulation layer 21 may be removed each by etching through the mask 45. Thereby, the drain contact hole 33 and the source contact hole 34 to expose the electron supply layer 8 are formed. Thereafter, the mask 45 is removed.

Figure 4J:
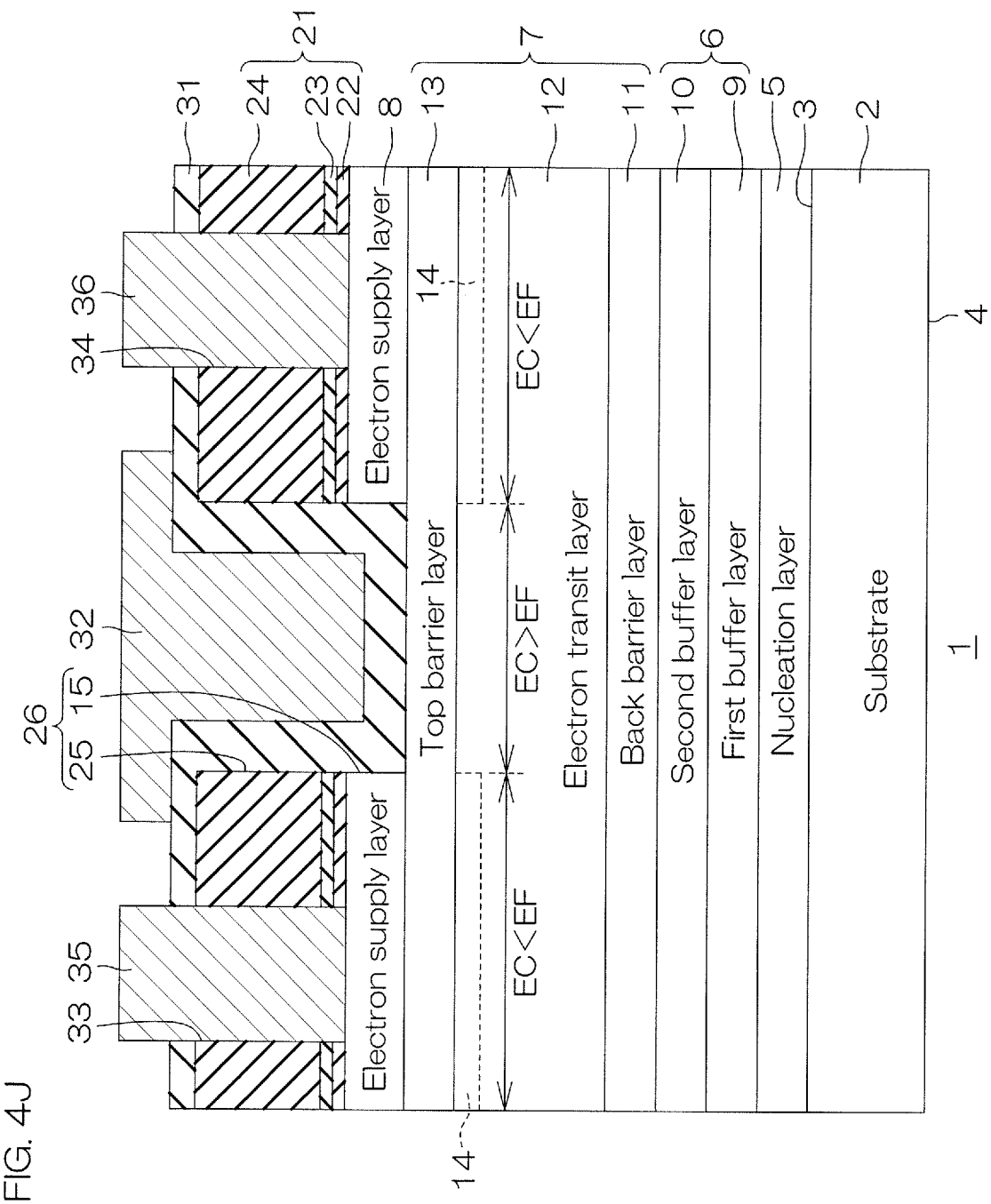

Next, with reference to FIG. 4J, the drain electrode 35 is embedded in the drain contact hole 33, while the source electrode 36 is embedded in the source contact hole 34. The drain electrode 35 and the source electrode 36 may be formed through formation of an electrically conductive layer by a CVD method and patterning the electrically conductive layer by etching. Through the steps above, the semiconductor device 1 is manufactured.

Figure 5:
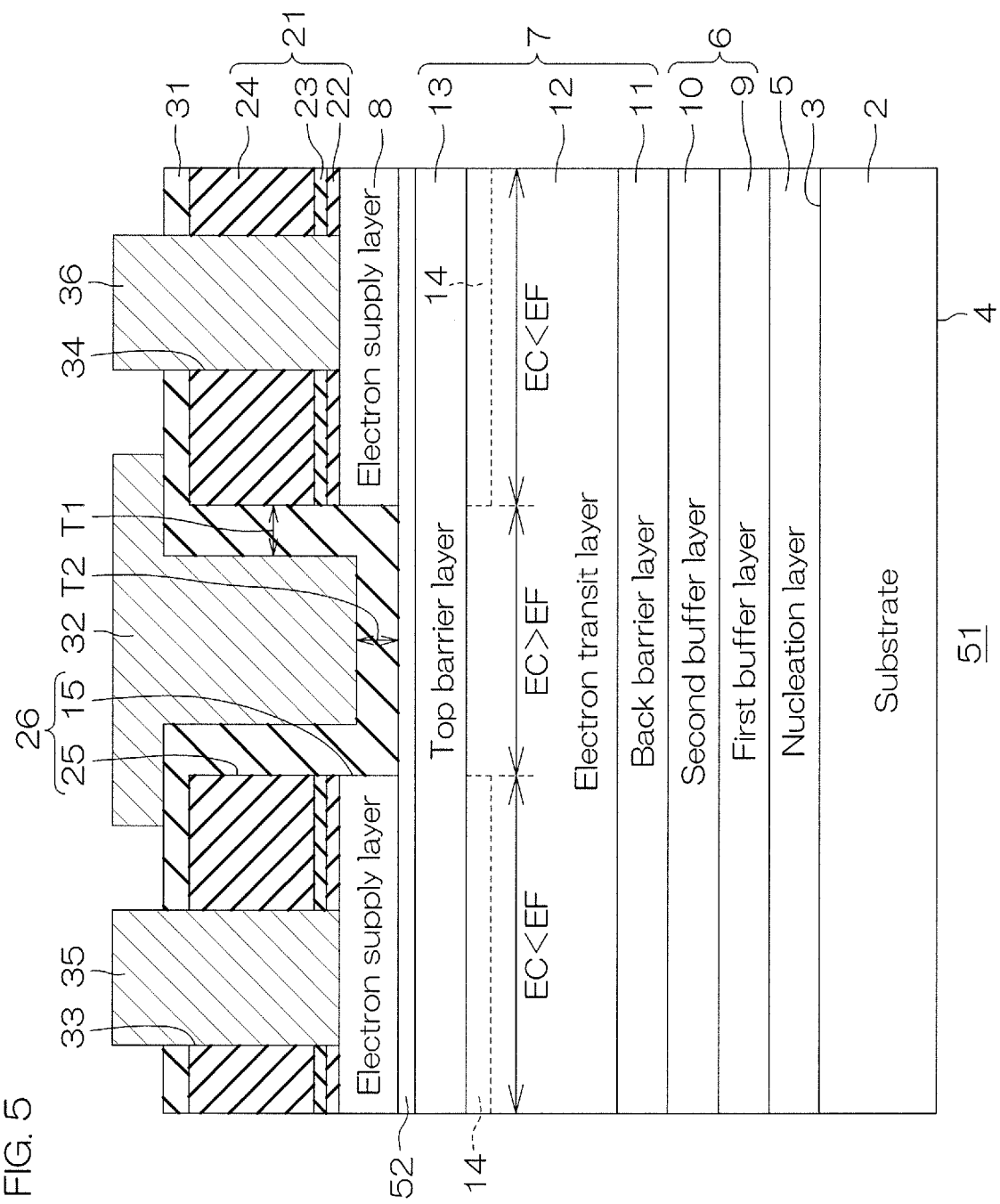
FIG. 5 is a cross-sectional view illustrating a semiconductor device according to a second preferred embodiment of the present invention.

FIG. 5 is a cross-sectional view illustrating a semiconductor device 51 according to a second preferred embodiment of the present invention. Hereinafter, the structures corresponding to structures of the semiconductor device 1 will be given the same reference signs, and description thereof will be omitted.

The semiconductor device 51 further includes a cap layer 52 that is interposed between the top barrier layer 13 and the electron supply layer 8. The cap layer 52 has a characteristic of being more resistant to oxidation than the top barrier layer 13. Specifically, the cap layer 52 is formed of a group III nitride semiconductor that contains no Al. More specifically, the cap layer 52 is formed of GaN.

The cap layer 52 has such a thickness that allows the two-dimensional electron gas region 14 to be present in an area that opposes the electron supply layer 8 in the surface layer portion of the electron transit layer 12. The cap layer 52 is exposed from the bottom of the gate contact hole 26. The gate insulating layer 31 is in contact with the cap layer 52.

After the step of forming the top barrier layer 13, the cap layer 52 is formed by epitaxially growing GaN on the top barrier layer 13 prior to the step of forming the electron supply layer 8.

As described above, according to the semiconductor device 51, the cap layer 52, which is more resistant to oxidation than the top barrier layer 13, is exposed from the gate contact hole 26 and in contact with the gate insulating layer 31. Thereby, while suppressing direct oxidation of the electron transit layer 12 by the top barrier layer 13 and the cap layer 52, oxidation of an area that is exposed from the gate contact hole 26 and in contact with the gate insulating layer 31 can be suppressed. As a result, since an increase in channel resistance can be suppressed, it is possible to enhance the stability of channel resistance.

Figure 6:
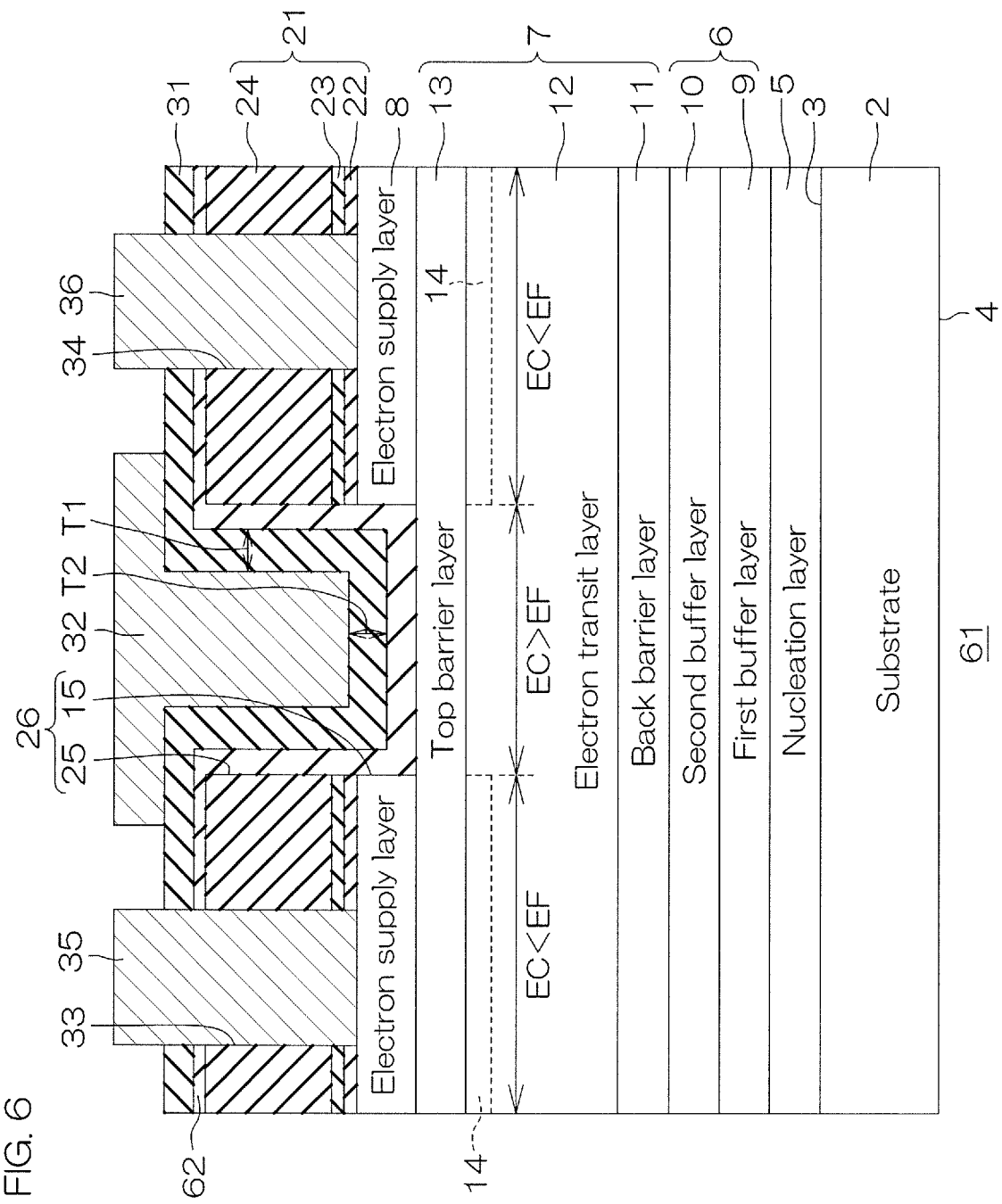
FIG. 6 is a cross-sectional view illustrating a semiconductor device according to a third preferred embodiment of the present invention.

FIG. 6 is a cross-sectional view illustrating a semiconductor device 61 according to a third preferred embodiment of the present invention. Hereinafter, the structures corresponding to structures of the semiconductor device 1 will be given the same reference signs, and description thereof will be omitted.

The semiconductor device 61 further includes a barrier insulating layer 62 that is interposed between the top barrier layer 13 and the gate insulating layer 31. The barrier insulating layer 62 is formed of an insulating material other than an oxide insulating material, and suppresses oxidation of the top barrier layer 13. For example, in the case of the gate insulating layer 31 being formed of an oxide insulating material, the barrier insulating layer 62 suppresses the gate insulating layer 31 from oxidizing the top barrier layer 13.

More specifically, the barrier insulating layer 62 contains $Al_\gamma Ga_{(1-\gamma)}N$ ($0<\gamma\leq1$) in an amorphous state. In the preferred embodiment, the barrier insulating layer 62 is formed of AlN in an amorphous state. The barrier insulating layer 62 is in contact with the top barrier layer 13 in the opening 15 of the electron supply layer 8.

This allows the electron supply layer 8 formed of AlN in a crystalline state and the barrier insulating layer 62 formed of AlN in an amorphous state to be positioned on the same surface (the surface of the top barrier layer 13). The barrier insulating layer 62 may have a thickness of 1-5 nm (both inclusive) (for example, approximately 1.5 nm).

The barrier insulating layer 62 has no piezoelectric characteristic. In an area in the surface layer portion of the electron transit layer 12 opposing the barrier insulating layer 62, such a state is held that the conduction band energy level EC is greater than the Fermi energy level EF (EC>EF). Thus, in a steady state, in an area in the surface layer portion of the electron transit layer 12 immediately below the gate electrode layer 32, no two-dimensional electron gas region 14 is present.

In the boundary region between the barrier insulating layer 62 and the gate insulating layer 31, a mixed crystalline layer (not illustrated) of the insulating material of the barrier insulating layer 62 and the insulating material of the gate insulating layer 31 may be present. The mixed crystalline layer may include an oxide insulator.

In the preferred embodiment, the barrier insulating layer 62 is led out in a film shape on the breakdown voltage sustaining insulation layer 21 along the inner wall of the gate contact hole 26 while being covered with the gate insulating layer 31. The barrier insulating layer 62 covers the surface of the breakdown voltage sustaining insulation layer 21. In the preferred embodiment, the barrier insulating layer 62 covers substantially the entire surface of the breakdown voltage sustaining insulation layer 21.

In the preferred embodiment, the drain contact hole 33 and the source contact hole 34 penetrate the gate insulating layer 31, the barrier insulating layer 62, and the breakdown voltage sustaining insulation layer 21 to expose the electron supply layer 8.

The step of forming the barrier insulating layer 62 is conducted prior to the step of forming the gate insulating layer 31. In the step of forming the barrier insulating layer 62, the barrier insulating layer 62 is formed on a portion of the top barrier layer 13 that is exposed from the opening 15 of the electron supply layer 8.

The barrier insulating layer 62 is formed to be led out in a film shape on the breakdown voltage sustaining insulation layer 21 along the inner wall of the gate contact hole 26. The barrier insulating layer 62 may be formed by atomic layer deposition (ALD). The processing temperature may be 300-600° C. (both inclusive).

After the step of forming the gate insulating layer 31, the barrier insulating layer 62 and the gate insulating layer 31 may be annealed. The annealing may be performed at a temperature of 500-900° C. (both inclusive) if the barrier insulating layer 62 and the gate insulating layer 31 are not crystalized.

As described above, according to the semiconductor device 61, the barrier insulating layer 62 containing $Al_\gamma Ga_{(1-\gamma)}N$ ($0<\gamma\leq1$) in an amorphous state is interposed between the top barrier layer 13 and the gate insulating layer 31. Thereby, oxidation of the top barrier layer 13 can be suppressed.

Furthermore, by the barrier insulating layer 62, generation of a Ga-O bond in an area between the top barrier layer 13 and the gate insulating layer 31 can be suppressed. The Ga-O bond is known to function as charge trapping. By suppressing the generation of the Ga-O bond, the time dependent accumulation of charge trapping can be suppressed. This enables suppressing undesired time dependent variations (increases) in the gate threshold voltage Vth.

The barrier insulating layer 62 may be applied to the semiconductor device 51. Furthermore, the cap layer 52 may be applied to the semiconductor device 61. That is, the semiconductor device 51 and the semiconductor device 61 may be provided with both the cap layer 52 and the barrier insulating layer 62 in addition to the structure of the semiconductor device 1.

Figure 7:
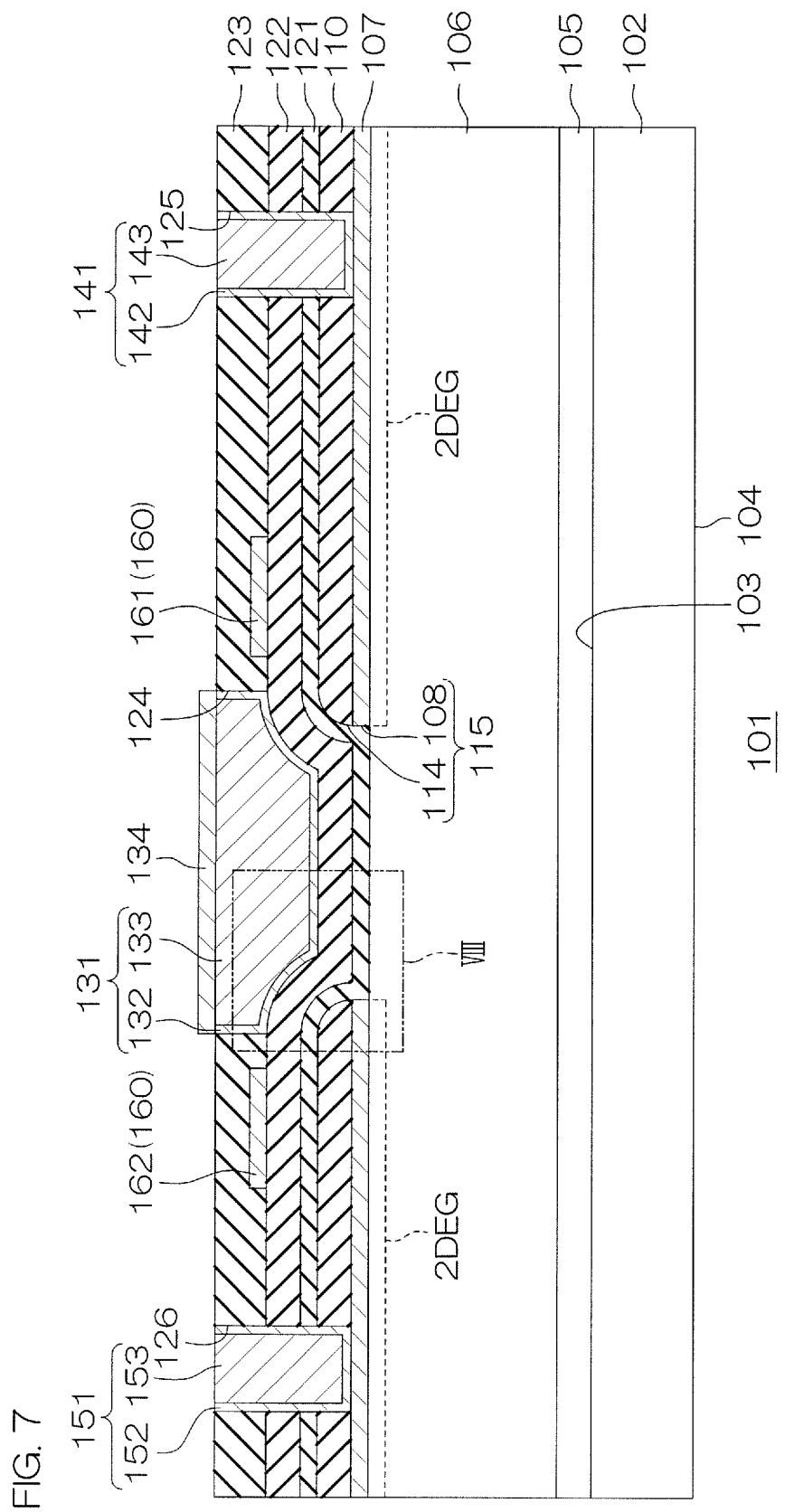
FIG. 7 is a cross-sectional view illustrating a semiconductor device according to a fourth preferred embodiment of the present invention.
Figure 8:
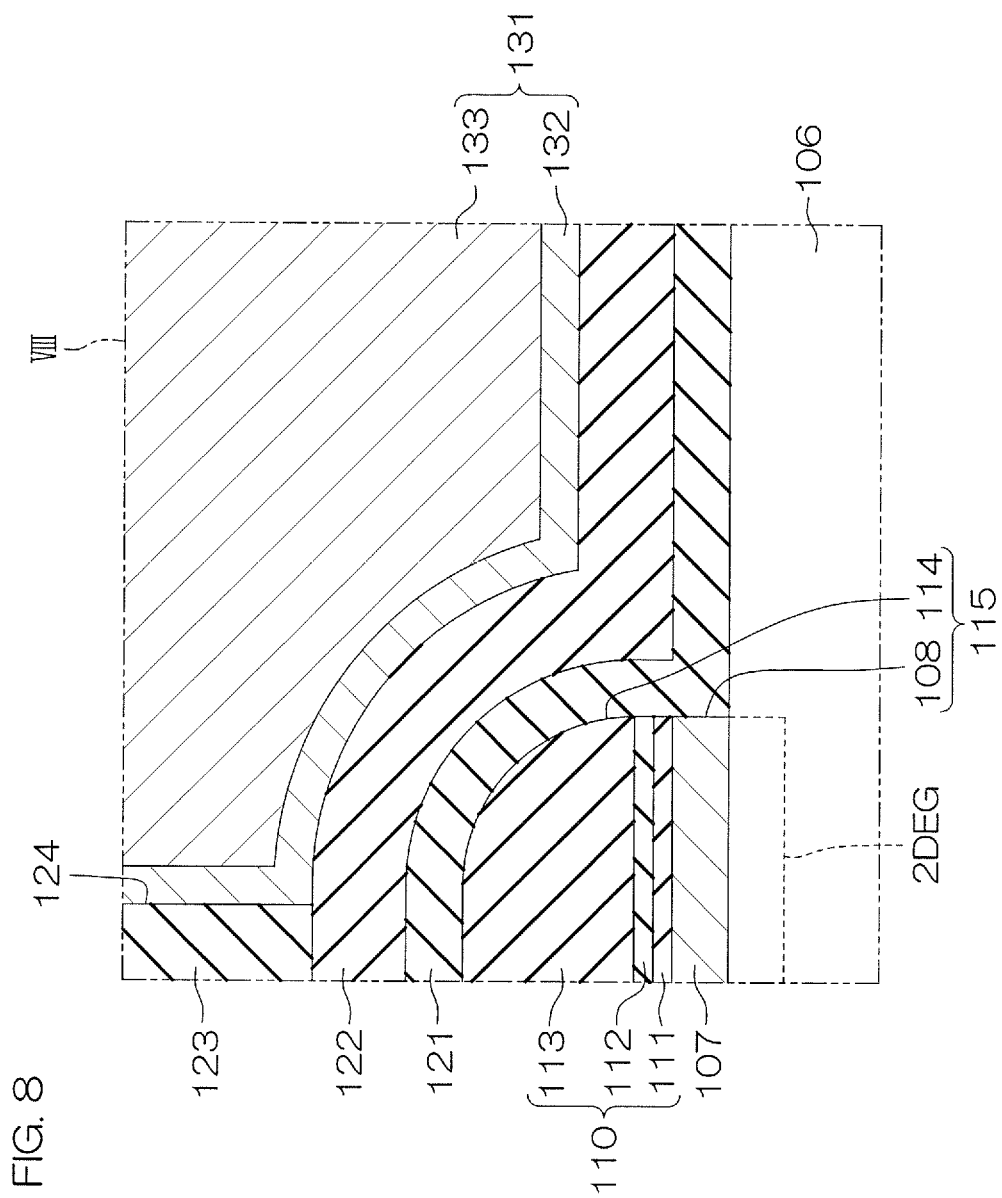
FIG. 8 is an expanded view of region VIII shown in FIG. 7.

FIG. 7 is a cross-sectional view illustrating a semiconductor device 101 according to a fourth preferred embodiment of the present invention. FIG. 8 is an expanded view of region VIII shown in FIG. 7.

The semiconductor device 101 has a fundamental arrangement which includes a high electron mobility transistor (HEMT) including a group III nitride semiconductor.

With reference to FIG. 7, the semiconductor device 101 includes a substrate 102. The substrate 102 may be, for example, an Si substrate, an SiC substrate, a sapphire substrate, or a GaN substrate. In the preferred embodiment, the substrate is formed of an Si substrate. The substrate 102 includes a first major surface 103 on one surface and a second major surface 104 on the other surface.

A buffer layer 105, an electron transit layer 106, and an electron supply layer 107 are formed in this order on the first major surface 103 of the substrate 102. The buffer layer 105 may contain AlN. The electron transit layer 106 is formed of a group III nitride semiconductor containing Ga. More specifically, the electron transit layer 106 contains $Al_aIn_bGa_{(1-a-b)}N$ ($0 \leq a+b \leq 1$). In the preferred embodiment, the electron transit layer 106 is formed of GaN. The electron transit layer 106 may have a thickness of 0.1-3.0 μm (both inclusive).

The electron supply layer 107 contains $Al_XGa_{(1-X)}N$ ($0 < X \leq 1$) in a crystalline state. In the preferred embodiment, the Al composition ratio X is 1. That is, the electron supply layer 107 is formed of AlN in a crystalline state. The electron supply layer 107 may have a thickness of 1-5 nm (both inclusive) (for example, approximately 2 nm).

An opening 108 to expose the electron transit layer 106 is formed in the electron supply layer 107. The electron transit layer 106 has an exposed portion that is exposed from the opening 108 and a cover portion that is covered with the electron supply layer 107. The exposed portion and the cover portion of the electron transit layer 106 present flat surfaces that continuously connected to each other. The exposed portion of the electron transit layer 106 is not recessed by one step toward the substrate 102 with respect to the cover portion of the electron transit layer 106.

In the surface layer portion of the electron transit layer 106 in a boundary region between the electron transit layer 106 and the electron supply layer 107, a two-dimensional electron gas (2DEG) is formed. The 2DEG is formed by the piezo polarization and the spontaneous polarization of the electron supply layer 107. The piezo polarization is formed resulting from a lattice mismatch between the electron transit layer 106 and the electron supply layer 107.

On the other hand, in the portion of the electron supply layer 107 where the opening 108 is formed, no 2DEG is present because the electron transit layer 106 is not in contact with the electron supply layer 107. Thus, the semiconductor device 101 has a normally-OFF structure.

With reference to FIGS. 7 and 8, a breakdown voltage sustaining insulation layer 110 (an insulating layer) is formed on the electron supply layer 107. In the preferred embodiment, the breakdown voltage sustaining insulation layer 110 has a layered structure that includes a flattened layer 111, a passivation layer 112, and a spacer layer 113, which are stacked in this order from the top of the electron supply layer 107.

The flattened layer 111 covers the electron supply layer 107. The flattened layer 111 is formed on the electron supply layer 107 in order to improve flatness. The flattened layer 111 may contain GaN. The flattened layer 111 may have a thickness of 1-5 nm (both inclusive) (for example, approximately 2 nm).

The passivation layer 112 covers the flattened layer 111. The passivation layer 112 may contain SiN. The passivation layer 112 prevents trapping of charges and maintains the insulation characteristic of the breakdown voltage sustaining insulation layer 110. The passivation layer 112 may have a thickness of 1-40 nm (both inclusive) (for example, approximately 25 nm).

The spacer layer 113 covers the passivation layer 112. The spacer layer 113 is greater in thickness than the flattened layer 111 and the passivation layer 112. The spacer layer 113 is formed to space a gate electrode layer 131, which will be discussed later, apart from the electron supply layer 107. The spacer layer 113 may contain $SiO_2$. The spacer layer 113 may have a thickness of 10-100 nm (both inclusive) (for example, approximately 30 nm).

A through hole 114 that communicates with the opening 108 of the electron supply layer 107 is formed in the breakdown voltage sustaining insulation layer 110. The through hole 114 defines one contact hole 115 in conjunction with the opening 108.

In the cross-sectional view, the contact hole 115 is formed in a tapered shape with the opening area greater than the bottom area. The opening edge of the contact hole 115 has an inward curved surface in the contact hole 115.

With reference to FIG. 7, a barrier insulating layer 121 is formed on the electron transit layer 106 in the opening 108 of the electron supply layer 107. The barrier insulating layer 121 contains $Al_YGa_{(1-Y)}N$ ($0 < Y \leq 1$) in an amorphous state. In the preferred embodiment, the Al composition ratio Y is 1. That is, the barrier insulating layer 121 is formed of AlN in an amorphous state.

The barrier insulating layer 121 may be equal to or smaller in thickness than the electron supply layer 107 or maybe equal to or greater in thickness than the electron supply layer 107. The barrier insulating layer 121 may have a thickness of 1-5 nm (both inclusive) (for example, approximately 1.5 nm).

The barrier insulating layer 121 has no piezoelectric characteristic. Thus, in a boundary region between the electron transit layer 106 and the barrier insulating layer 121, no 2DEG is present in the surface layer portion of the electron transit layer 106. The barrier insulating layer 121 suppresses gallium atoms contained in the electron supply layer 107 from being bonded to oxygen atoms.

The barrier insulating layer 121 is in contact with the electron transit layer 106 in the opening 108 of the electron supply layer 107. Thereby, the electron supply layer 107 formed of AlN in a crystalline state and the barrier insulating layer 121 formed of AlN in an amorphous state are positioned on the same surface.

Furthermore, the barrier insulating layer 121 is led out in a film shape on the breakdown voltage sustaining insulation layer 110 via the inner wall of the contact hole 115. Thereby, the barrier insulating layer 121 covers the surface of the breakdown voltage sustaining insulation layer 110. In the preferred embodiment, the barrier insulating layer 121 covers substantially the entire surface of the breakdown voltage sustaining insulation layer 110.

A gate insulating layer 122 is formed on the barrier insulating layer 121 in the opening 108 of the electron supply layer 107. The gate insulating layer 122 contains an oxide insulating material. The gate insulating layer 122 preferably contains an oxide insulating material in an amorphous state. The gate insulating layer 122 may have a thickness of 5-40 nm (both inclusive) (for example, approximately 15 nm).

The oxide insulating material contains at least one type of $SiO_2$, SiON, $Al_2O_3$, HfSiO and $HfO_2$. The gate insulating layer 122 may have a single-layer structure that is formed of an $SiO_2$ layer, an SiON layer, an $Al_2O_3$ layer, an HfSiO layer, or an $HfO_2$ layer. The gate insulating layer 122 may also have a layered structure that includes at least one of an $SiO_2$ layer, an SiON layer, an $Al_2O_3$ layer, an HfSiO layer, and an $HfO_2$ layer.

The gate insulating layer 122 may contain SiN in addition to an oxide insulating material. In this case, the gate insulating layer 122 may have a layered structure in which a SiN layer and at least one type of oxide insulating material layer among an $SiO_2$ layer, an SiON layer, an $Al_2O_3$ layer, an HfSiO layer, and an $HfO_2$ layer are included. In the preferred embodiment, the gate insulating layer 122 is formed of an SiO$_2$ layer in an amorphous state.

The gate insulating layer 122 is led out, above the breakdown voltage sustaining insulation layer 110, in a film shape on the barrier insulating layer 121 via the inner wall of the contact hole 115. Thereby, the gate insulating layer 122 opposes the electron supply layer 107 with the breakdown voltage sustaining insulation layer 110 interposed between the gate insulating layer 122 and the electron supply layer 107. Furthermore, the gate insulating layer 122 covers the surface of the breakdown voltage sustaining insulation layer 110 via the barrier insulating layer 121.

In the preferred embodiment, the gate insulating layer 122 covers substantially the entire surface of the breakdown voltage sustaining insulation layer 110. In a boundary region between the barrier insulating layer 121 and the gate insulating layer 122, a mixed crystalline layer (not illustrated) of the insulating material of the barrier insulating layer 121 and the insulating material of the gate insulating layer 122 may be present. The mixed crystalline layer may include an oxide insulator.

An interlayer insulating layer 123 is formed on the gate insulating layer 122. The interlayer insulating layer 123 may cover substantially the entire surface of the gate insulating layer 122. The interlayer insulating layer 123 may have a single-layer structure that includes a single insulating material layer. The interlayer insulating layer 123 may also have a layered structure in which a plurality of insulating material layers are layered. The interlayer insulating layer 123 may include an SiO$_2$ layer and/or an SiN layer.

A gate opening 124, a drain opening 125, and a source opening 126 are formed in the interlayer insulating layer 123 to be spaced apart from each other. The gate opening 124 is formed in an area in the interlayer insulating layer 123 which opposes the opening 108 of the electron supply layer 107. The gate opening 124 penetrates the interlayer insulating layer 123, and exposes the gate insulating layer 122.

The drain opening 125 and the source opening 126 are formed in respective areas opposing the electron supply layer 107 in the interlayer insulating layer 123. The drain opening 125 and the source opening 126 penetrate the interlayer insulating layer 123, the gate insulating layer 122, and the breakdown voltage sustaining insulation layer 110 each to expose the electron supply layer 107.

The gate electrode layer 131 is embedded in the gate opening 124. The gate electrode layer 131 has a layered structure which includes a gate underlayer 132 and a gate embedded layer 133. The gate underlayer 132 may include a TiN layer. The gate embedded layer 133 may include a W (tungsten) layer.

The gate underlayer 132 is formed in a film shape along the inner wall of the gate opening 124 to define a recessed space in the gate opening 124. The gate embedded layer 133 fills in the recessed space defined by the gate underlayer 132.

The gate electrode layer 131 has an exposed portion that is exposed from the gate opening 124. The exposed portion of the gate electrode layer 131 is covered with a barrier electrode layer 134. The barrier electrode layer 134 may have a layered structure that includes a Ti layer, a TiN layer, and an AlCu layer, which are stacked in this order from the top of the gate electrode layer 131.

A drain electrode layer 141 is embedded in the drain opening 125. The drain electrode layer 141 has a layered structure that includes a drain underlayer 142 and a drain embedded layer 143. The drain underlayer 142 may include a Ti layer. The drain embedded layer 143 may include an Al layer.

The drain underlayer 142 is formed in a film shape along the inner wall of the drain opening 125 so that a recessed space is defined in the drain opening 125. The drain embedded layer 143 fills in the recessed space defined by the drain underlayer 142.

A source electrode layer 151 is embedded in the source opening 126. The source electrode layer 151 has a layered structure that includes a source underlayer 152 and a source embedded layer 153. The source underlayer 152 may include a Ti layer. The source embedded layer 153 may include an Al layer.

The source underlayer 152 is formed in a film shape along the inner wall of the source opening 126 so that a recessed space is defined in the source opening 126. The source embedded layer 153 fills in the recessed space defined by the source underlayer 152.

The distance between the gate electrode layer 131 and the drain electrode layer 141 may be greater than the distance between the gate electrode layer 131 and the source electrode layer 151. The distance between the gate electrode layer 131 and the drain electrode layer 141 may be 2-5 μm (both inclusive) (for example, approximately 3.5 μm). The distance between the gate electrode layer 131 and the source electrode layer 151 may be 0.5-2.0 μm (both inclusive) (for example, approximately 1.0 μm).

A field plate 160 may be formed on the surface of the gate insulating layer 122 in an area around the gate electrode layer 131. The field plate 160 alleviates an electric field concentration on the gate electrode layer 131. In the preferred embodiment, the field plate 160 opposes the barrier insulating layer 121 with the gate insulating layer 122 interposed between the field plate 160 and the barrier insulating layer 121.

The field plate 160 is covered by the interlayer insulating layer 123. The field plate 160 is formed to be spaced apart by at least 0.1 μm or more from the gate electrode layer 131. The field plate 160 may include a TiN layer.

In the preferred embodiment, the field plate 160 includes a first field plate 161 and a second field plate 162. The first field plate 161 is formed in an area on the surface of the gate insulating layer 122 between the gate electrode layer 131 and the drain electrode layer 141. The second field plate 162 is formed in an area on the surface of the gate insulating layer 122 between the gate electrode layer 131 and the source electrode layer 151.

In the preferred embodiment, a source voltage is applied to the first field plate 161 and the second field plate 162. That is, in the preferred embodiment, the first field plate 161 and the second field plate 162 are at the same potential as that of the source electrode layer 151.

Either one of or both the first field plate 161 and the second field plate 162 may be electrically released from the gate electrode layer 131, the drain electrode layer 141, and the source electrode layer 151. That is, either one of or both the first field plate 161 and the second field plate 162 may be in an electrically floating state.

The first field plate 161 may be greater in width than the second field plate 162. The first field plate 161 may have a width of 0.5 μm or greater. The first field plate 161 may have a width of 0.5 μm or less.

The distance between the field plate 160 and the barrier insulating layer 121 may be adjusted by interposing another insulating layer in an area between the field plate 160 and the gate insulating layer 122. In this case, the distance between the field plate 160 and the barrier insulating layer 121 may be 30-100 μm (both inclusive) (for example, approximately 50 μm).

Figure 9:
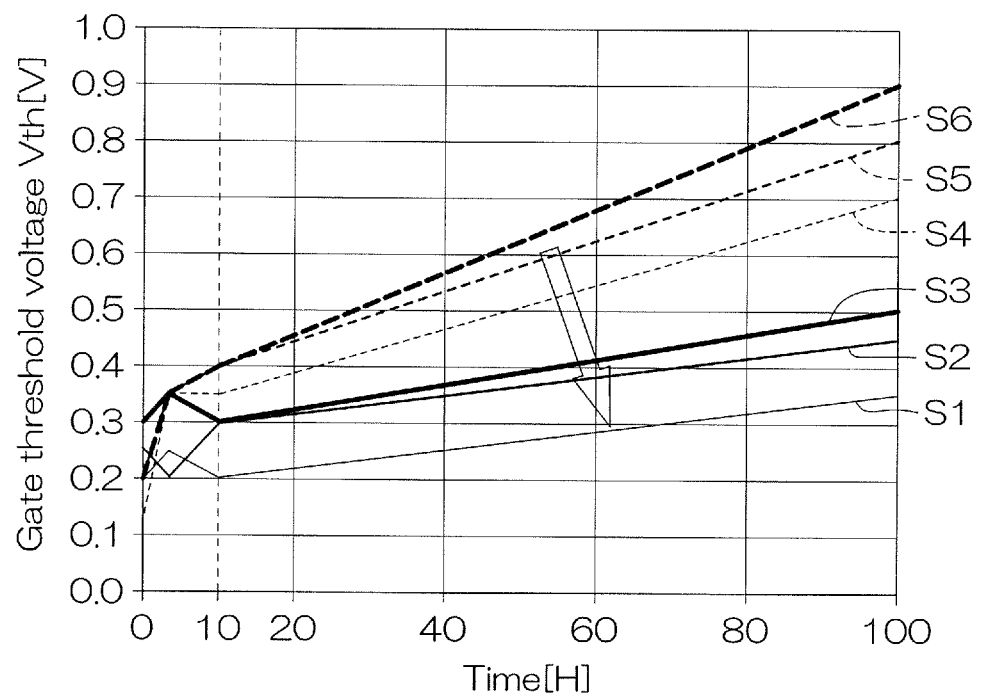
FIG. 9 is a graph showing the time dependent characteristic of the gate threshold voltage of the semiconductor device shown in FIG. 7.

FIG. 9 is a graph showing a time dependent characteristic of the gate threshold voltage Vth of the semiconductor device 101 shown in FIG. 7. The gate threshold voltage Vth is a gate-source voltage VGS at which a drain current ID starts to flow.

The graph shown in FIG. 9 is determined by a simulation test of a high temperature gate bias (HTGB). In the test, variations in the gate threshold voltage Vth under continuous application of a predetermined gate-source voltage VGS (for example, approximately +5V) for 100 hours at a temperature of 150° C. were examined.

FIG. 9 shows a first characteristic S1, a second characteristic S2, and a third characteristic S3 (see the solid lines). The first characteristic S1, the second characteristic S2, and the third characteristic S3 each show the time dependent characteristic of the gate threshold voltage Vth of the semiconductor device 101. FIG. 9 further shows a fourth characteristic S4, a fifth characteristic S5, and a sixth characteristic S6 (see the broken lines). The fourth characteristic S4, the fifth characteristic S5, and the sixth characteristic S6 each show the time dependent characteristic of the gate threshold voltage Vth of a semiconductor device according to a comparative example.

The semiconductor device according to the comparative example has substantially the same structure as that of the semiconductor device 101 except that the barrier insulating layer 121 is not provided. Specific description of the semiconductor device according to the comparative example will be omitted.

The first characteristic S1, the second characteristic S2, and the third characteristic S3 show the time dependent characteristic of the gate threshold voltage Vth when the barrier insulating layer 121 has a thickness of approximately 3 nm, and the gate insulating layer 122 has a thickness of approximately 15 nm. The fourth characteristic S4, the fifth characteristic S5, and the sixth characteristic S6 show the time dependent characteristic of the gate threshold voltage Vth when the gate insulating layer 122 has a thickness of approximately 15 nm.

With reference to FIG. 9, numerical values before 10 hours elapsed were unstable. Thus, hereinafter, the range after 10 hours elapsed to 100 hours will be described.

With reference to the first characteristic S1, the gate threshold voltage Vth was 0.2 V when the gate-source voltage VGS was continuously applied for 10 hours, while the gate threshold voltage Vth was 0.35 V when being continuously applied for 100 hours. The fluctuation rate of the gate threshold voltage Vth was 175%.

With reference to the second characteristic S2, the gate threshold voltage Vth was 0.3 V when the gate-source voltage VGS was continuously applied for 10 hours, while the gate threshold voltage Vth was 0.45 V when being continuously applied for 100 hours. The fluctuation rate of the gate threshold voltage Vth was 150%.

With reference to the third characteristic S3, the gate threshold voltage Vth was 0.3 V when the gate-source voltage VGS was continuously applied for 10 hours, while the gate threshold voltage Vth was 0.5 V when being continuously applied for 100 hours. The fluctuation rate of the gate threshold voltage Vth was 167%.

From the results above, according to the semiconductor device 101, it was found that the fluctuation rate of the gate threshold voltage Vth can be suppressed to 180% or less when a predetermined gate-source voltage VGS was continuously applied for 100 hours.

In contrast to this, with reference to the fourth characteristic S4, the fifth characteristic S5, and the sixth characteristic S6, according to the semiconductor device of the comparative example, the fluctuation rate of the gate threshold voltage Vth was 200% or greater when a predetermined gate-source voltage VGS was continuously applied for 100 hours.

As described above, according to the semiconductor device 101, the barrier insulating layer 121 containing $Al_YGa_{(1-Y)}N$ ($0<Y\leq1$) in an amorphous state is formed between the electron transit layer 106 containing Ga and the gate insulating layer 122 containing the oxide insulating material.

This makes it possible to suppress the electron transit layer 106 and the gate insulating layer 122 from coming into contact with each other. As a result, in an area between the electron transit layer 106 and the gate insulating layer 122, the generation of the Ga-O bond formed by gallium atoms and oxygen atoms being bonded together can be suppressed. It is thus possible to suppress a time dependent increase in the gate threshold voltage Vth (refer to FIG. 9).

Furthermore, the barrier insulating layer 121 is capable of reducing the risk of crystalline defects because the barrier insulating layer 121 is in an amorphous state. It is thus possible to suppress a gate leakage current caused by a crystalline defect of the barrier insulating layer 121.

FIGS. 10A to 10M are cross-sectional views illustrating an example of a manufacturing method of the semiconductor device 101 shown in FIG. 7.

Figure 10A:
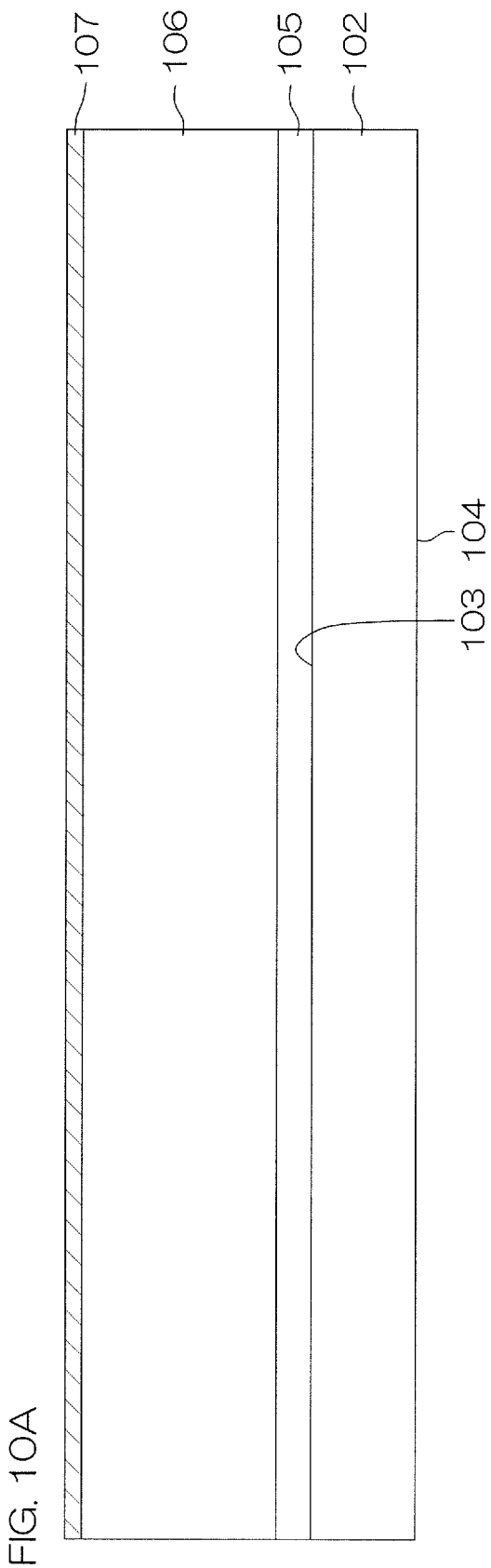

With reference to FIG. 10A, first, the substrate 102 is prepared. In the preferred embodiment, the substrate 102 is an Si substrate. Next, the buffer layer 105, the electron transit layer 106, and the electron supply layer 107 are formed in this order on the first major surface 103 of the substrate 102. The buffer layer 105, the electron transit layer 106, and the electron supply layer 107 are each formed by epitaxial growth.

More specifically, the buffer layer 105 is formed by epitaxially growing AlN from the top of the substrate 102. The electron transit layer 106 is formed by epitaxially growing $Al_aIn_bGa_{(1-a-b)}N$ (GaN in the preferred embodiment) from the top of the buffer layer 105. The electron supply layer 107 is formed by epitaxially growing $Al_XGa_{(1-X)}N$ (AlN in the preferred embodiment) from the top of the electron transit layer 106.

Next, with reference to FIG. 10B, the breakdown voltage sustaining insulation layer 110 is formed on the electron supply layer 107. The step of forming the breakdown voltage sustaining insulation layer 110 includes steps of forming the flattened layer 111, the passivation layer 112, and the spacer layer 113 in this order from the top of the electron supply layer 107 (also refer to FIG. 8).

The flattened layer 111 is formed by epitaxially growing GaN from the top of the electron supply layer 107. The passivation layer 112 may be formed by a CVD method. The passivation layer 112 may contain SiN. The spacer layer 113 maybe formed by a CVD method. The spacer layer 113 may contain $SiO_2$.

Next, with reference to FIG. 10C, on the breakdown voltage sustaining insulation layer 110, a mask 171 having a predetermined pattern is formed. The mask 171 may be a resist mask that is formed of a photosensitive resin. The mask 171 has an opening 172 to expose an area in which the through hole 114 is to be formed.

Next, the unnecessary portion of the breakdown voltage sustaining insulation layer 110 is removed. The unnecessary portion of the breakdown voltage sustaining insulation layer 110 maybe removed by etching through the mask 171. Thereby, the through hole 114 is formed in the breakdown voltage sustaining insulation layer 110. After the through hole 114 is formed, the mask 171 is removed.

Figure 10D:
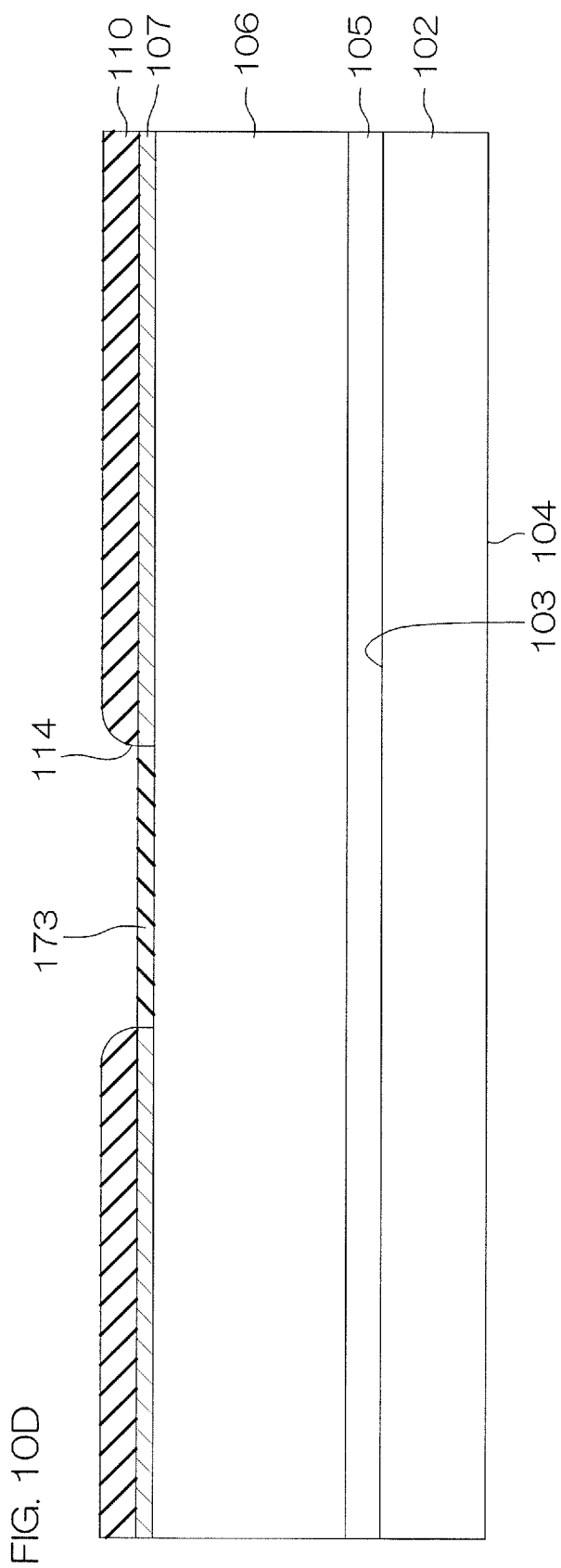

Next, with reference to FIG. 10D, the part in the electron supply layer 107 that is exposed from the through hole 114 of the breakdown voltage sustaining insulation layer 110 is oxidized by an oxidation treatment method. Thereby, an oxide 173 of the electron supply layer 107 is formed in the through hole 114 of the breakdown voltage sustaining insulation layer 110. The oxide 173 may contain AlON or $Al_2O_3$.

The oxidation treatment method may be a plasma oxidation treatment method. The plasma oxidation treatment method is performed in an oxygen gas atmosphere until the entire portion of the electron supply layer 107 that is exposed from the through hole 114 is oxidized. The processing temperature may be 100-900° C. (both inclusive). The processing time may be 1-15 hours (both inclusive). The oxygen concentration in the oxygen gas may be approximately 30%.

According to the plasma oxidation, when the oxide 173 is formed, the oxygen in the atmosphere does not enter or hardly enters the electron transit layer 106. Thus, the surface portion of the electron transit layer 106 is not oxidized or hardly oxidized.

Next, with reference to FIG. 10E, the oxide 173 is removed. The oxide 173 maybe removed by etching (for example, by wet etching). The etching liquid may be a sulfuric acid hydrogen peroxide mixture (SPM) that contains a sulfuric acid and a hydrogen peroxide solution.

The oxide 173 is different from the electron supply layer 107 in etching selection ratio. Thus, at the time of removal of the oxide 173, the electron supply layer 107 is hardly removed. Thereby, the opening 108 that communicates with the through hole 114 is formed in the electron supply layer 107. The opening 108 defines one contact hole 115 in conjunction with the through hole 114.

The oxide 173 contains no Ga (gallium). The oxide 173 is different from the electron transit layer 106 in etching selection ratio. Thus, at the time of removal of the oxide 173, the electron transit layer 106 is hardly removed. Thereby, a portion of the electron transit layer 106 that defines the bottom wall of the opening 108 and a portion of the electron transit layer 106 that is in contact with the electron supply layer 107 present flat surfaces that are flash with each other.

Figure 10F:
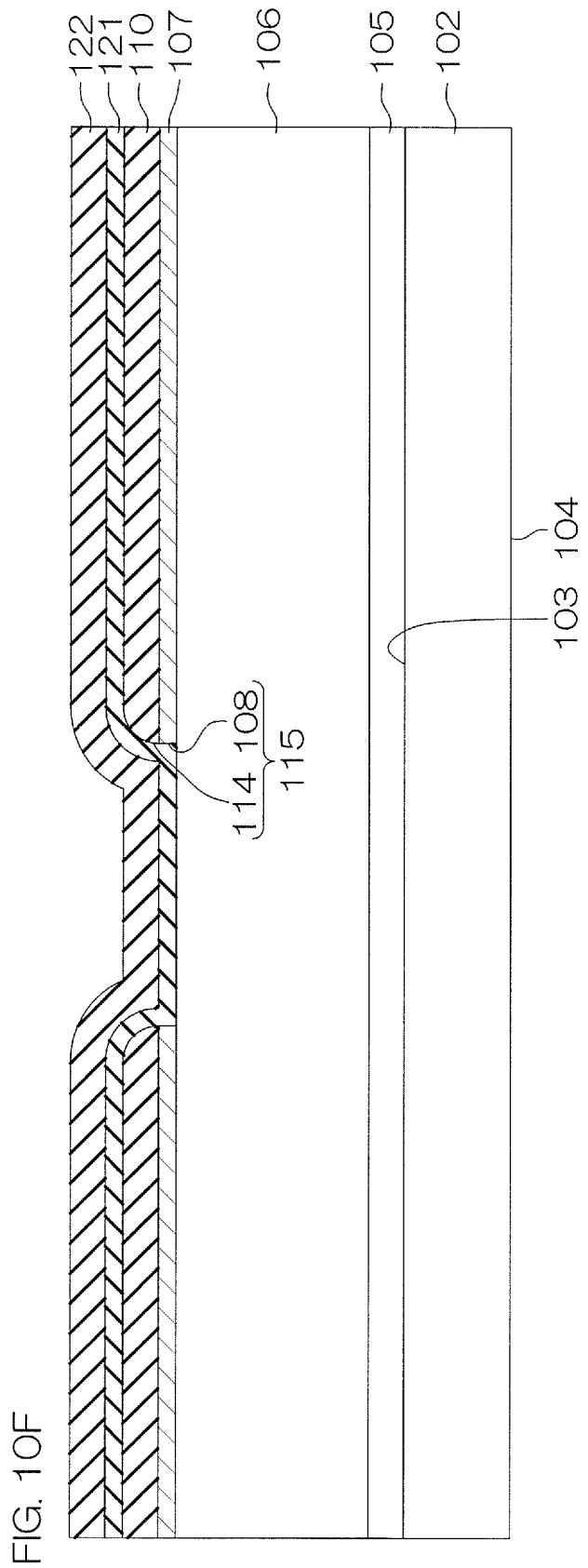

Next, with reference to FIG. 10F, the barrier insulating layer 121 is formed on the portion of the electron transit layer 106 that is exposed from the opening 108. In the preferred embodiment, the barrier insulating layer 121 is formed on the breakdown voltage sustaining insulation layer 110 so as to be led out in a film shape via the inner wall of the contact hole 115. The barrier insulating layer 121 contains $Al_YGa_{(1-Y)}N$ in an amorphous state (AlN in the preferred embodiment). The barrier insulating layer 121 may be formed by atomic layer deposition (ALD) at a temperature of 300-600° C. (both inclusive).

Next, the gate insulating layer 122 is formed on the barrier insulating layer 121. In the preferred embodiment, the gate insulating layer 122 is formed to be led out in a film shape on the breakdown voltage sustaining insulation layer 110 via the inner wall of the contact hole 115. In the preferred embodiment, the gate insulating layer 122 contains $SiO_2$ in an amorphous state. The gate insulating layer 122 may be formed by ALD.

Next, the barrier insulating layer 121 and the gate insulating layer 122 are annealed. The annealing may be carried out at a temperature of 500-900° C. (both inclusive) as long as the barrier insulating layer 121 and the gate insulating layer 122 are not crystalized.

Figure 10G:
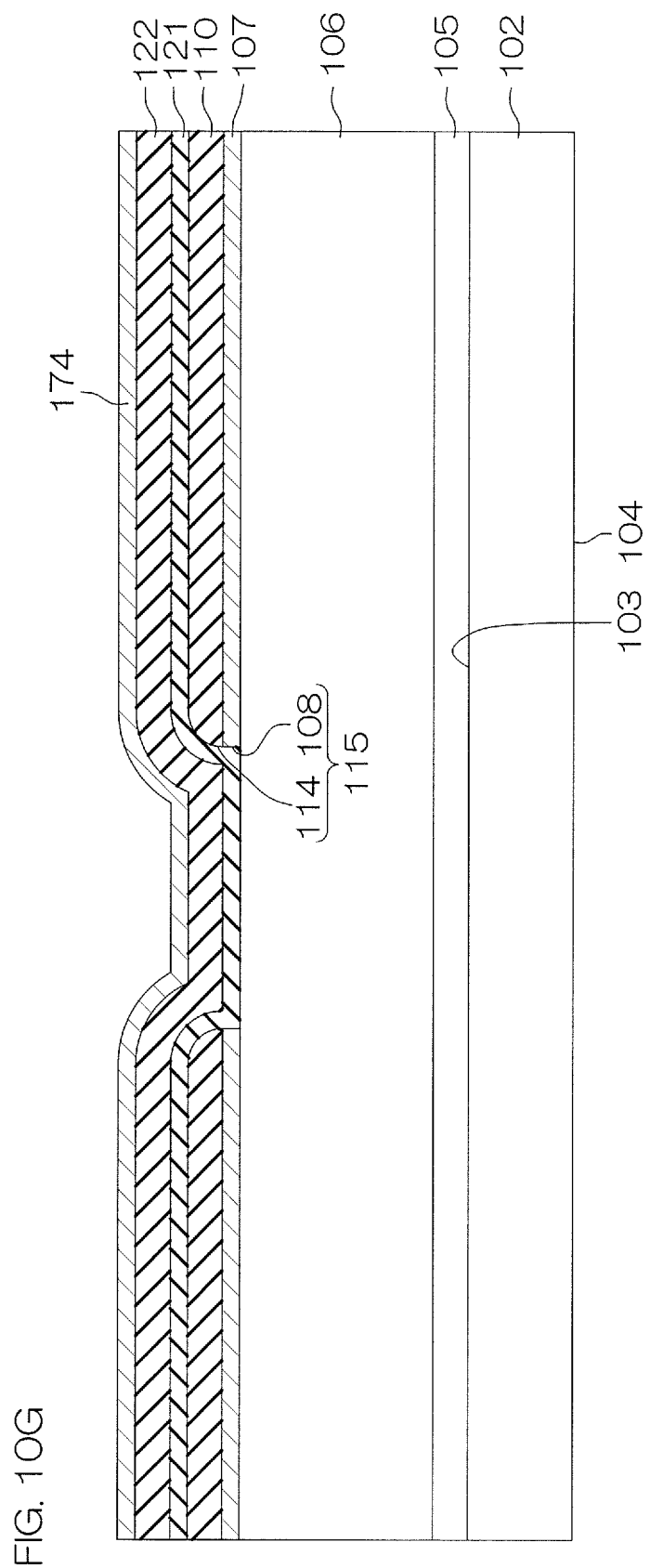

Next, with reference to FIG. 10G, an electrical conductor layer 174 is formed on the gate insulating layer 122. In the preferred embodiment, the electrical conductor layer 174 contains TiN. The electrical conductor layer 174 may be formed by a CVD method.

Next, with reference to FIG. 10H, a mask 175 having a predetermined pattern is formed on the electrical conductor layer 174. The mask 175 may be a resist mask that is formed of a photosensitive resin. The mask 175 covers an area in which the field plate 160 is to be formed.

Next, the unnecessary portions of the electrical conductor layer 174 is removed. The unnecessary portions of the electrical conductor layer 174 may be removed by etching through the mask 175. Thereby, the field plate 160 is formed. The field plate 160 may be formed on another insulating layer after the another insulating layer is formed on the gate insulating layer 122.

Figure 10I:
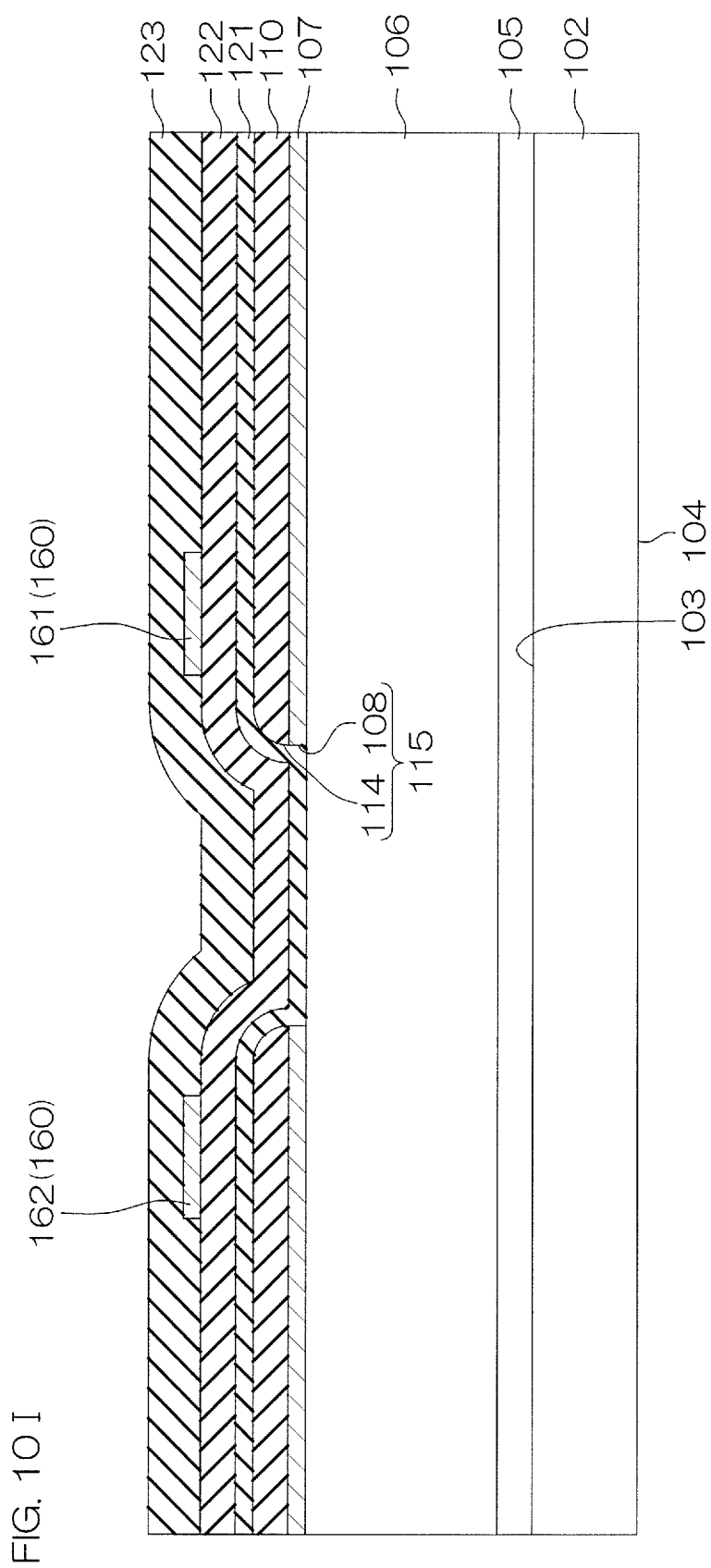

Next, with reference to FIG. 10I, the interlayer insulating layer 123 is formed on the gate insulating layer 122. The interlayer insulating layer 123 covers the field plate 160. In the preferred embodiment, the interlayer insulating layer 123 contains $SiO_2$. The interlayer insulating layer 123 may be formed by a CVD method.

Figure 10J:
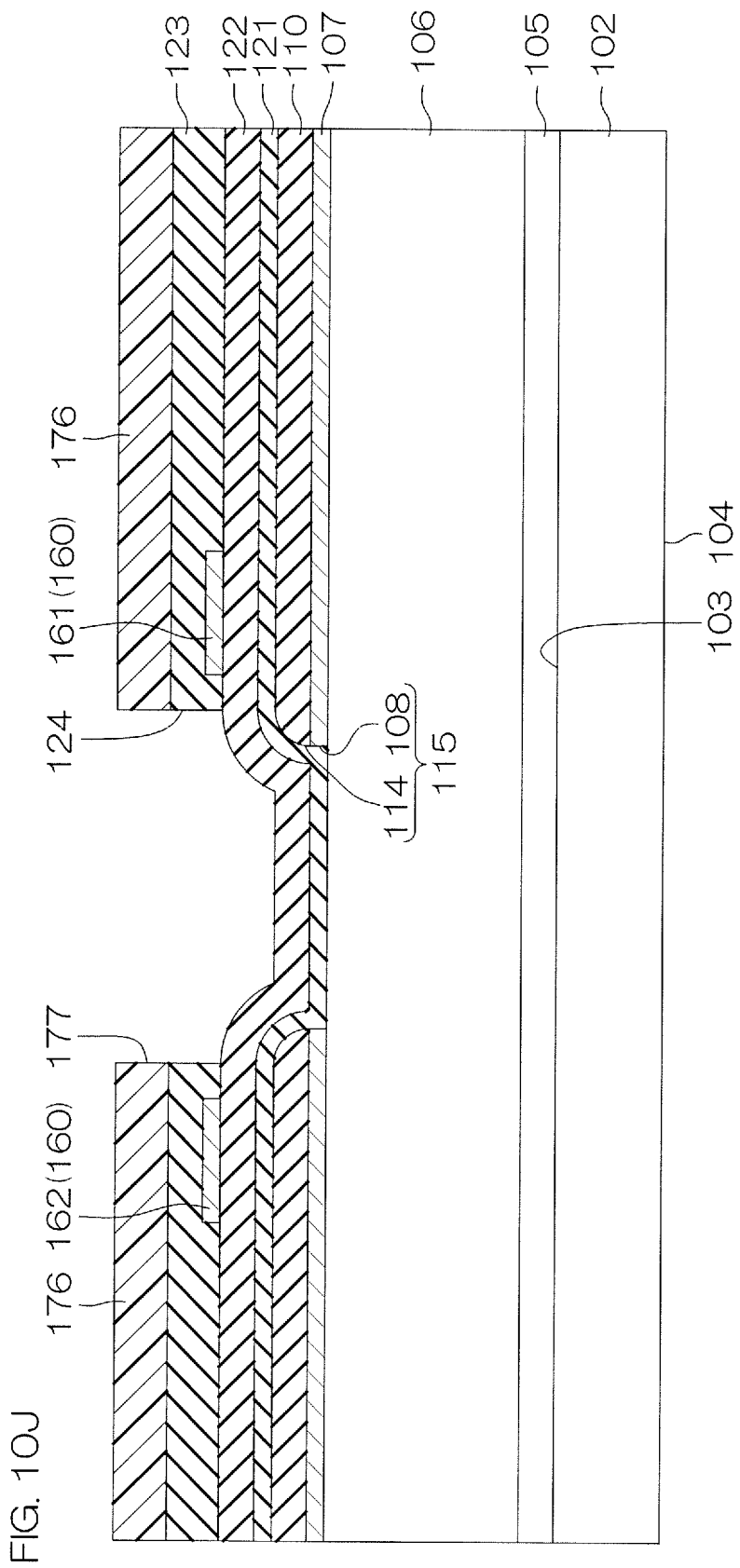

Next, with reference to FIG. 10J, a mask 176 having a predetermined pattern is formed on the interlayer insulating layer 123. The mask 176 may be a resist mask that is formed of a photosensitive resin. The mask 176 has an opening 177 to expose an area of the interlayer insulating layer 123 in which the gate opening 124 is to be formed.

Next, the unnecessary portion of the interlayer insulating layer 123 is removed. The unnecessary portion of the interlayer insulating layer 123 may be removed by etching through the mask 176. Thereby, the gate opening 124 is formed in the interlayer insulating layer 123. The mask 176 is then removed.

Figure 10K:
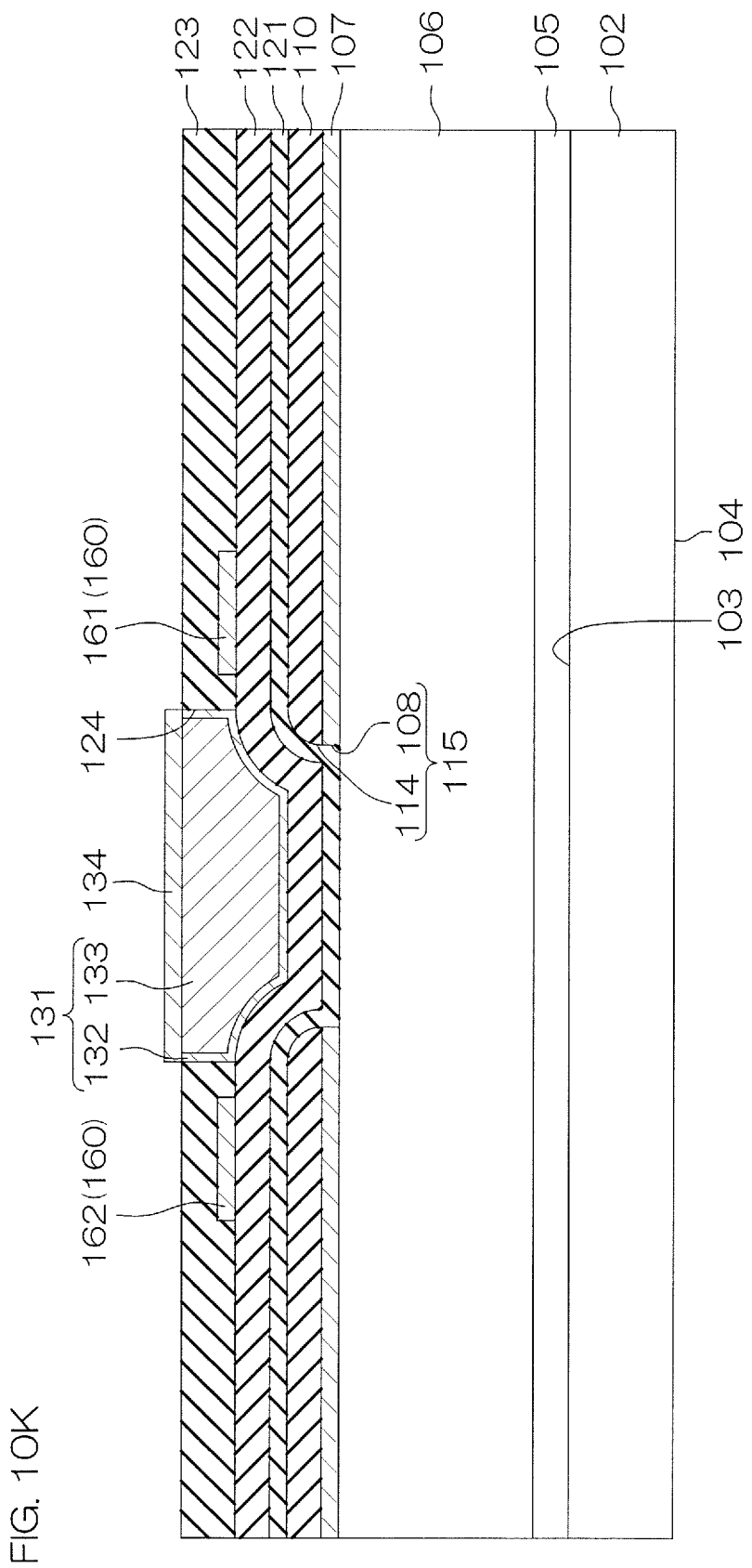

Next, with reference to FIG. 10K, the gate electrode layer 131 and the barrier electrode layer 134 are formed. The step of forming the gate electrode layer 131 includes formation of the gate underlayer 132 and formation of the gate embedded layer 133.

The gate underlayer 132 is formed in a film shape along the inner wall of the gate opening 124 so that a recessed space is defined in the gate opening 124. The gate underlayer 132 includes a TiN layer. The gate underlayer 132 may be formed by sputtering.

The gate embedded layer 133 is formed to fill in the recessed space defined by the gate underlayer 132 in the gate opening 124. The gate embedded layer 133 includes a W (tungsten) layer. The gate embedded layer 133 may be formed by a CVD method.

The barrier electrode layer 134 is formed in the gate electrode layer 131 so as to cover the exposed portion that is exposed from the gate opening 124. In the preferred embodiment, the step of forming the barrier electrode layer 134 includes formation of a Ti layer, a TiN layer, and an AlCu layer in this order from the top of the gate electrode layer 131. The Ti layer, the TiN layer, and the AlCu layer may be each formed by sputtering.

Figure 10L:
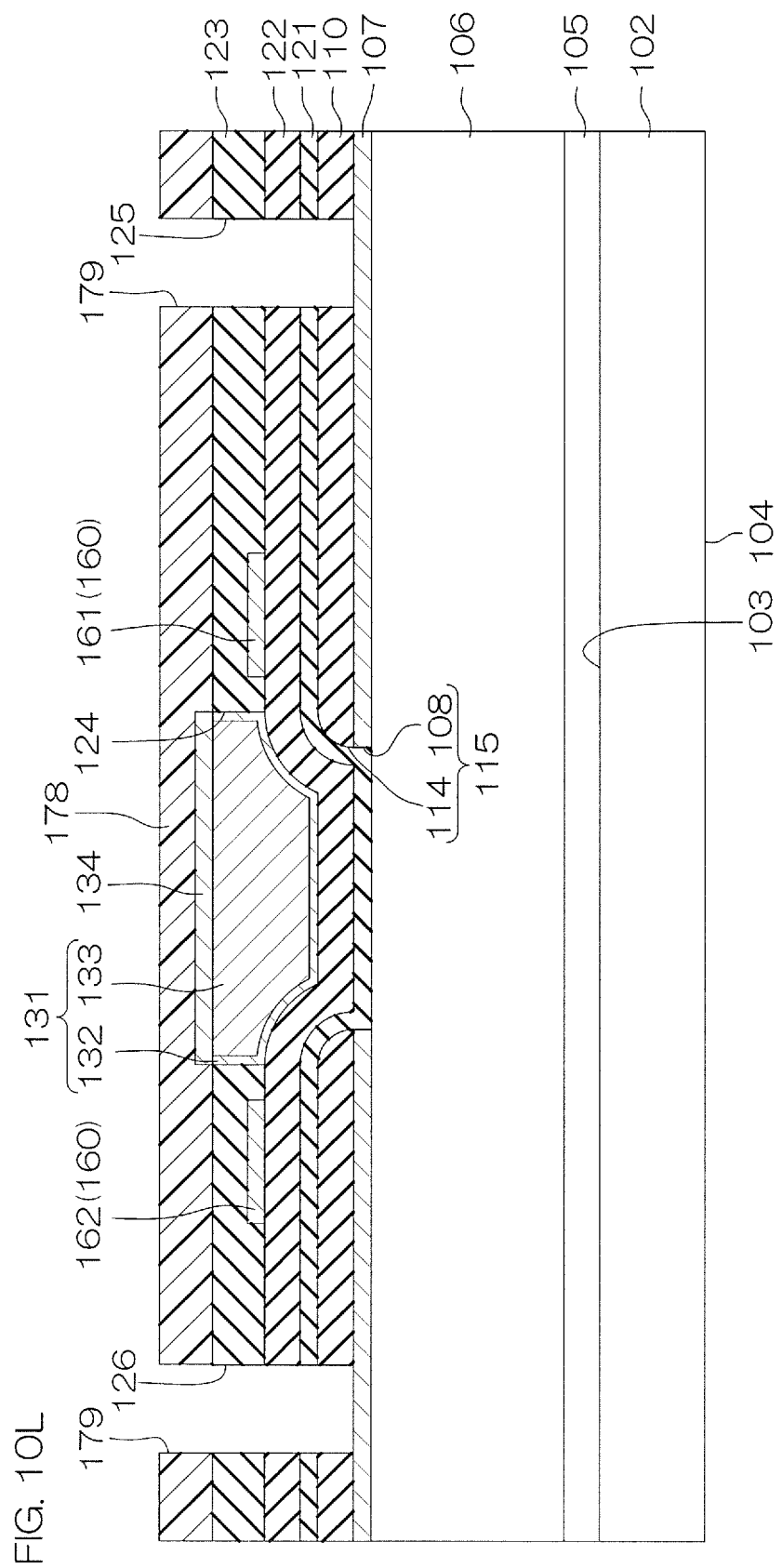

Next, with reference to FIG. 10L, a mask 178 having a predetermined pattern is formed on the interlayer insulating layer 123. The mask 178 may be a resist mask that is formed of a photosensitive resin. The mask 178 has openings 179 to expose areas in which the drain opening 125 and the source opening 126 are to be formed in the interlayer insulating layer 123.

Next, the unnecessary portions of the interlayer insulating layer 123 are removed. The unnecessary portions of the interlayer insulating layer 123 may be removed by etching through the mask 178. Thereby, the drain opening 125 and the source opening 126 are formed in the interlayer insulating layer 123. Thereafter, the mask 178 is removed.

Figure 10M:
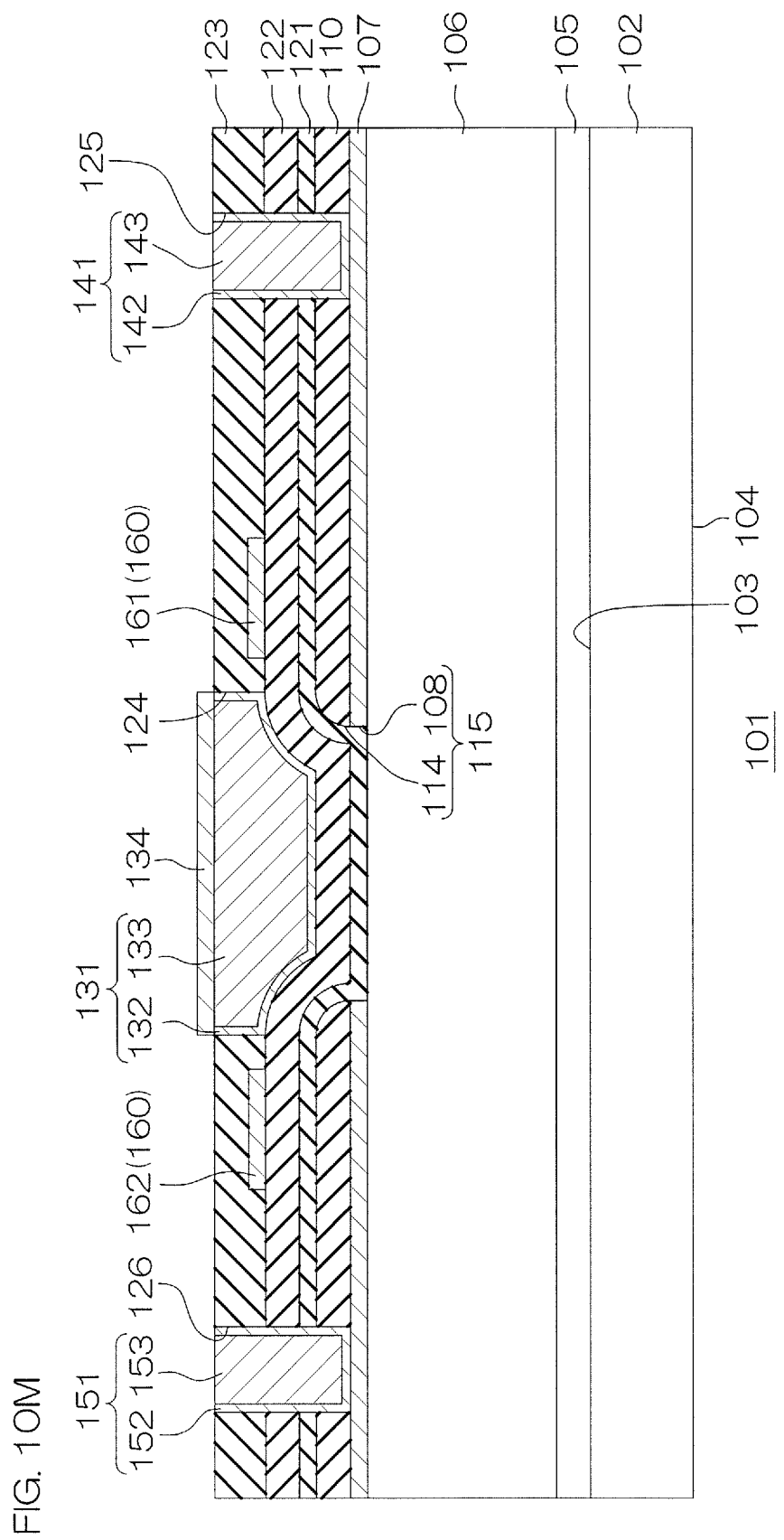

Next, with reference to FIG. 10M, the drain electrode layer 141 and the source electrode layer 151 are formed. The step of forming the drain electrode layer 141 and the source electrode layer 151 includes a step of forming the drain underlayer 142 and the source underlayer 152 and a step of forming the drain embedded layer 143 and the source embedded layer 153, respectively.

The drain underlayer 142 and the source underlayer 152 are each formed in a film shape along the inner wall of the drain opening 125 and the source opening 126 so that a recessed space is defined in the drain opening 125 and the source opening 126, respectively. The drain underlayer 142 and the source underlayer 152 each include a Ti layer. The drain underlayer 142 and the source underlayer 152 maybe formed simultaneously by sputtering.

The drain embedded layer 143 and the source embedded layer 153 are formed to fill in the recessed space defined by the drain underlayer 142 and the source underlayer 152 in the drain opening 125 and the source opening 126, respectively.

The drain embedded layer 143 and the source embedded layer 153 each include an Al layer. The drain embedded layer 143 and the source embedded layer 153 may be formed simultaneously by a CVD method. Through the steps mentioned above, the semiconductor device 101 is manufactured.

As described above, the preferred embodiments of the present invention are described; however, the present invention can be implemented in other modes.

For example, in the third preferred embodiment, description is made of such an example in which the barrier insulating layer 62 contains $Al_\gamma Ga_{(1-\gamma)}N$ (AlN) in an amorphous state.

However, in place of, or in addition to $Al_\gamma Ga_{(1-\gamma)}N$ (AlN) in an amorphous state, the barrier insulating layer 62 may contain SiN in an amorphous state. That is, in place of $Al_\gamma Ga_{(1-\gamma)}N$ (AlN) in an amorphous state, the barrier insulating layer 62 may have a single-layer structure formed of an SiN layer in an amorphous state.

Furthermore, the barrier insulating layer 62 may have a layered structure which includes an SiN layer in an amorphous state and an $Al_\gamma Ga_{(1-\gamma)}N$ (AlN) layer in an amorphous state formed on the SiN layer in an amorphous state.

Furthermore, the barrier insulating layer 62 may have a layered structure which includes an $Al_\gamma Ga_{(1-\gamma)}N$ (AlN) layer in an amorphous state and an SiN layer in an amorphous state formed on the $Al_\gamma Ga_{(1-\gamma)}N$ (AlN) layer in an amorphous state.

Example features that are extracted from the description and drawings will be described below.

JP2011-192834A discloses a semiconductor device that includes a high electron mobility transistor (HEMT). The semiconductor device includes a GaN layer (an electron transit layer). An AlGaN layer (an electron supply layer) is formed on the GaN layer.

The AlGaN layer has an opening to expose the GaN layer. A gate oxidation layer that contains $SiO_2$ is formed in the opening of the AlGaN layer. A gate electrode layer is formed on the gate oxidation layer.

In the semiconductor device that includes an HEMT, the gate threshold voltage increases over time. The inventor of the present application has ascertained that a structure in which a gate oxidation layer is formed on an electron transit layer is found to be part of the cause of the problem.

That is, in the structure in which the gate oxidation layer is formed on the electron transit layer, a Ga-O bond is produced, into which a gallium atom and an oxygen atom are bonded in a boundary region between the electron transit layer and the gate oxidation layer. The Ga-O bond serves as charge trapping.

Thus, charges flowing through the electron transit layer are captured and accumulated by the Ga-O bond. As a result, a trap level is formed in a boundary region between the electron transit layer and the gate oxidation layer, leading to a time dependent increase in the gate threshold voltage.

Thus, hereinafter, a semiconductor device capable of suppressing a time dependent increase in the gate threshold voltage and a manufacturing method of the semiconductor device are provided.

[A1] A semiconductor device which includes: an electron transit layer formed of a nitride semiconductor containing Ga; an electron supply layer which contains $Al_X Ga_{(1-X)}N$ (0<X≤1) in a crystalline state and has an opening formed on the electron transit layer to expose the electron transit layer; a barrier insulating layer which contains $Al_Y Ga_{(1-Y)}N$ (0<Y≤1) in an amorphous state and is formed on the electron transit layer in the opening of the electron supply layer; a gate insulating layer that contains an oxide insulating material and is formed on the barrier insulating layer; and a gate electrode layer formed on the gate insulating layer.

According to the semiconductor device, the barrier insulating layer containing $Al_Y Ga_{(1-Y)}N$ (0<Y≤1) in an amorphous state is interposed between the electron transit layer and the gate insulating layer. This allows the barrier insulating layer to suppress the generation of the Ga-O bond in an area between the electron transit layer and the gate insulating layer. As a result, it is possible to suppress a time dependent increase in the gate threshold voltage.

[A2] The semiconductor device according to A1, wherein the gate insulating layer is greater in thickness than the barrier insulating layer.

[A3] The semiconductor device according to A1 or A2, further including a mixed crystalline layer which is present in a boundary area between the barrier insulating layer and the gate insulating layer and which is formed of mixed crystal of the insulating material of the barrier insulating layer and the insulating material of the gate insulating layer.

[A4] The semiconductor device according to anyone of A1 to A3, further including an insulating layer which covers the electron supply layer and has a through hole that communicates with the opening of the electron supply layer to define one contact hole in conjunction with the opening, wherein the gate electrode layer enters the contact hole from the top of the insulating layer.

[A5] The semiconductor device according to A4, wherein the insulating layer includes: a passivation layer formed on the electron supply layer; and a spacer layer which is formed on the passivation layer to space the gate electrode layer apart from the electron supply layer.

[A6] The semiconductor device according to A5, wherein the spacer layer is greater in thickness than the passivation layer.

[A7] The semiconductor device according to A5 or A6, wherein the passivation layer contains SiN, and the spacer layer contains $SiO_2$.

[A8] A manufacturing method of a semiconductor device, the method including: a step of preparing an electron transit layer formed of a nitride semiconductor containing Ga; a step of forming, on the electron transit layer, an electron supply layer which contains $Al_XGa_{(1-X)}N$ ($0<X\le1$) in a crystalline state and has an opening to expose the electron transit layer; a step of forming, on the electron transit layer, a barrier insulating layer which contains $Al_YGa_{(1-Y)}N$ ($0<Y\le1$) in an amorphous state in the opening of the electron supply layer; a step of forming, on the barrier insulating layer, a gate insulating layer which contains an oxide insulating material; and a step of forming a gate electrode layer on the gate insulating layer.

According to the manufacturing method, the barrier insulating layer containing $Al_YGa_{(1-Y)}N$ ($0<Y\le1$) in an amorphous state is formed between the electron transit layer and the gate insulating layer. This allows the barrier insulating layer to suppress the generation of a Ga-O bond in an area between the electron transit layer and the gate insulating layer. As a result, it is possible to manufacture a semiconductor device that is capable of suppressing a time dependent increase in gate threshold voltage.

[A9] The manufacturing method of a semiconductor device according to A8, wherein the gate insulating layer is formed to have a thickness that is greater than the thickness of the barrier insulating layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
    a back barrier layer containing $Al_XGa_{(1-X)}N$ ($0<X\le1$);
    an electron transit layer containing $Al_aIn_bGa_{(1-a-b)}N$ ($0\le a+b\le1$) and formed on the back barrier layer;
    a top barrier layer containing $Al_YGa_{(1-Y)}N$ ($0<Y\le1$) and formed on the electron transit layer;
    an electron supply layer containing $Al_ZGa_{(1-Z)}N$ ($0<Z\le1$) and formed on the top barrier layer, the electron supply layer having an opening to expose the top barrier layer;
    a two-dimensional electron gas region formed in a first area of a surface layer portion of the electron transit layer but not in a second area of the surface layer portion of the electron transit layer;
    a gate insulating layer formed in the opening of the electron supply layer; and
    a gate electrode layer formed on the gate insulating layer and opposing the electron transit layer with the gate insulating layer interposed between the gate electrode layer and the electron transit layer,
    wherein the first area opposes the electron supply layer so that a first portion of the top barrier layer is interposed between the electron supply layer and the first area, and
    the second area opposes the opening in the electron supply layer so that a second portion of the top barrier layer is interposed between the gate insulating layer and the second area.

2. The semiconductor device according to claim 1, wherein
    the electron supply layer has a lattice constant which allows a conduction band energy level of the surface layer portion of the electron transit layer to be a Fermi energy level or smaller in the first area, the lattice constant allowing a conduction band energy level of the surface layer portion of the electron transit layer to be greater than the Fermi energy level in the second area.

3. The semiconductor device according to claim 1, wherein the electron supply layer has a lattice constant that is smaller than a lattice constant of the top barrier layer.

4. The semiconductor device according to claim 1, wherein the electron transit layer has a lattice constant that is greater than a lattice constant of the back barrier layer.

5. The semiconductor device according to claim 1, wherein the top barrier layer has a lattice constant that is smaller than a lattice constant of the electron transit layer.

6. The semiconductor device according to claim 1, wherein the electron transit layer is formed of GaN.

7. The semiconductor device according to claim 1, wherein the electron supply layer is formed of AlN.

8. The semiconductor device according to claim 1, further comprising a cap layer that is interposed in an area between the top barrier layer and the electron supply layer and is formed of a group III nitride semiconductor containing no Al.

9. The semiconductor device according to claim 8, wherein the cap layer is formed of GaN.

10. The semiconductor device according to claim 1, further comprising a barrier insulating layer that is interposed in an area between the top barrier layer and the gate insulating layer and is formed of an insulating material other than an oxide insulating material.

11. The semiconductor device according to claim 10, wherein the barrier insulating layer contains $Al_\gamma Ga_{(1-\gamma)}N$ ($0<\gamma\le1$) in an amorphous state.

12. The semiconductor device according to claim 11, wherein $\gamma=1$.

13. The semiconductor device according to claim 10, wherein the barrier insulating layer contains SiN in an amorphous state.

14. A method of preparing the semiconductor device of claim 1, comprising:
    forming an electron transit layer containing $Al_aIn_bGa_{(1-a-b)}N$ ($0\le a+b\le1$) on a back barrier layer containing $Al_XGa_{(1-X)}N$ ($0<X\le1$);
    forming a top barrier layer containing $Al_YGa_{(1-Y)}N$ ($0<Y\le1$) on the electron transit layer so that a conduction band energy level of an interface with the electron transit layer is greater than a Fermi energy level;
    forming an electron supply layer containing $Al_ZGa_{(1-Z)}N$ ($0<Z\le1$) on the top barrier layer so that the conduction band energy level of the interface between the top barrier layer and the electron transit layer is smaller than the Fermi energy level;
    oxidizing a portion of the electron supply layer into an oxide, removing the oxide to form an opening that exposes the top barrier layer in the electron supply layer, and making the conduction band energy level of the interface between the top barrier layer and the electron transit layer in an area opposing the opening to be greater than the Fermi energy level;
    forming a gate insulating layer above the top barrier layer at a portion thereof being exposed from the opening of the electron supply layer; and
    forming a gate electrode layer on the gate insulating layer,
    wherein forming the electron transit layer comprises
        forming a two-dimensional electron gas region in a first area of a surface layer portion of the electron transit layer but not in a second area of the surface layer portion of the electron transit layer,
    the first area opposes the electron supply layer so that a first portion of the top barrier layer is interposed between the electron supply layer and the first area, and
    the second area opposes the opening in the electron supply layer so that a second portion of the top barrier layer is interposed between the gate insulating layer and the second area.

15. The method of claim 14, wherein
oxidizing the portion of the electron supply layer into the oxide includes a step of oxidizing the portion of the electron supply layer by plasma oxidation; and
removing the oxide includes a step of removing the oxide by wet etching.

16. The method of claim 14, wherein the oxide contains AlON or $Al_2O_3$.

17. The method of claim 14, wherein forming the electron transit layer includes a step of forming a layer composed of GaN.

18. The method of claim 14, wherein the step of forming the electron supply layer includes a step of forming a layer composed of AlN.

19. The method of claim 14, further comprising forming a cap layer on the top barrier layer after forming the top barrier layer and prior to forming the electron supply layer, the cap layer being formed of a group III nitride semiconductor that contains no Al.

20. The method of claim 14, further comprising forming a barrier insulating layer formed of an insulating material other than an oxide insulating material on a portion of the top barrier layer exposed from the opening of the electron supply layer after forming the top barrier layer and prior to forming the gate insulating layer, wherein
the gate insulating layer is formed on the barrier insulating layer.

* * * * *